US006276844B1

(12) United States Patent
Coteus et al.

(10) Patent No.: US 6,276,844 B1
(45) Date of Patent: *Aug. 21, 2001

(54) CLUSTERED, BUFFERED SIMMS AND ASSEMBLIES THEREOF

(75) Inventors: Paul William Coteus, Yorktown Heights, NY (US); Ralph Herman Genz, Pflugerville, TX (US); Alphonso P. Lanzetta, Marlboro, NY (US); Warren Edward Maule, Cedar Park; Daniel Julius Phipps, Round Rock, both of TX (US); James K. Tam, Shrub Oak, NY (US); James Donald Wagoner, Georgetown, TX (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/744,006

(22) Filed: Oct. 30, 1996

Related U.S. Application Data

(63) Continuation of application No. 08/162,745, filed on Dec. 6, 1993, now abandoned.

(51) Int. Cl.[7] ...................................................... G06F 12/00
(52) U.S. Cl. ........................ 395/401; 395/401; 395/405; 395/427
(58) Field of Search .................................... 395/401, 405, 395/427, 402, 494, 821, 853; 711/2, 4, 5, 101–106, 167, 168

(56) References Cited

U.S. PATENT DOCUMENTS

| | | | | |
|---|---|---|---|---|
| 4,021,784 | * | 5/1977 | Kimlinger | 340/172.5 |
| 5,053,951 | * | 10/1991 | Nusinov | 711/206 |
| 5,151,374 | * | 9/1992 | Wu | 438/154 |
| 5,283,877 | * | 2/1994 | Gastinel et al. | 395/432 |
| 5,293,603 | * | 3/1994 | MacWilliams et al. | 395/309 |
| 5,333,293 | * | 7/1994 | Bonella | 711/167 |

* cited by examiner

Primary Examiner—Than Nguyen
(74) Attorney, Agent, or Firm—Thomas A. Beck; Daniel Morris

(57) ABSTRACT

A data processing system including an improved method and apparatus for the arrangement and interconnection between electronic devices to improve system cycle time. The apparatus possesses a) a plurality of: memory SIMMs, memory devices on the noted memory SIMMs and registers; b) a clock; c) means for connecting signals between the memory devices on the memory SIMMs and the registers; and d) means for connecting signals between the memory devices on the memory SIMMs and the clocks.

6 Claims, 23 Drawing Sheets

| PIN # | A SIDE | B SIDE | PIN # | A SIDE | B SIDE |
|---|---|---|---|---|---|
| 1 | Vss | PDE | | Key | Key |
| 2 | PD0 | Vdd | | Key | Key |
| 3 | Vdd | PD1 | | Key | Key |
| 4 | PD3 | PD2 | | Key | Key |
| 5 | d | Vss | 27 | d | Vdd |
| 6 | Vss | d | 28 | Vdd | d |
| 7 | CIKO | Vdd | 29 | d | d |
| 8 | Vdd | d | 30 | d | Vss |
| 9 | d | d | 31 | Vss | d |
| 10 | d | Vss | 32 | d | Vdd |
| 11 | Vss | d | 33 | Vdd | d |
| 12 | d | Vdd | 34 | d | d |
| 13 | Vdd | d | 35 | d | Vss |
| 14 | d | d | 36 | Vss | d |
| 15 | d | Vss | 37 | A12 | Vdd |
| 16 | Vss | RFU | 38 | Vdd | A4 |
| 17 | d | Vdd | 39 | A5 | A6 |
| 18 | Vdd | d | 40 | A7 | Vss |
| 19 | d | d | 41 | Vss | A8 |
| 20 | d | Vss | 42 | CIKI | Vdd |
| 21 | Vss | d | 43 | Vdd | A9 |
| 22 | d | Vdd | 44 | CIKE | DQM |
| 23 | Vdd | d | 45 | WE | Vss |
| 24 | d | d | | center | center |
| 25 | d | Vss | | | |
| 26 | Vss | d | | | |

FIG.5

| PIN # | A SIDE | B SIDE | PIN # | A SIDE | B SIDE |
|---|---|---|---|---|---|
| 46 | CAS | Vss | | Key | Key |
| 47 | CSI | RAS | | Key | Key |
| 48 | Vdd | CS0 | | Key | Key |
| 49 | A11 | Vdd | | Key | Key |
| 50 | Vss | A10 | 71 | d | Vss |
| 51 | A0 | Vss | 72 | d | d |
| 52 | A2 | A1 | 73 | Vdd | d |
| 53 | Vdd | A3 | 74 | Clk2 | Vdd |
| 54 | A13 | Vdd | 75 | Vss | RFU |
| 55 | Vss | d | 76 | d | Vss |
| 56 | d | Vss | 77 | d | d |
| 57 | d | d | 78 | Vdd | d |
| 58 | Vdd | d | 79 | d | Vdd |
| 59 | d | Vdd | 80 | Vss | d |
| 60 | Vss | d | 81 | d | Vss |
| 61 | d | Vss | 82 | d | d |
| 62 | d | d | 83 | Vdd | d |
| 63 | Vdd | d | 84 | d | Vdd |
| 64 | d | Vdd | 85 | Vss | d |
| 65 | Vss | d | 86 | d | Vss |
| 66 | d | Vss | 87 | PD5 | PD4 |
| 67 | d | d | 88 | Vdd | PD6 |
| 68 | Vdd | d | 89 | PD7 | Vdd |
| 69 | d | Vdd | 90 | Vss | Inad |
| 70 | Vss | d | | | |

FIG.6

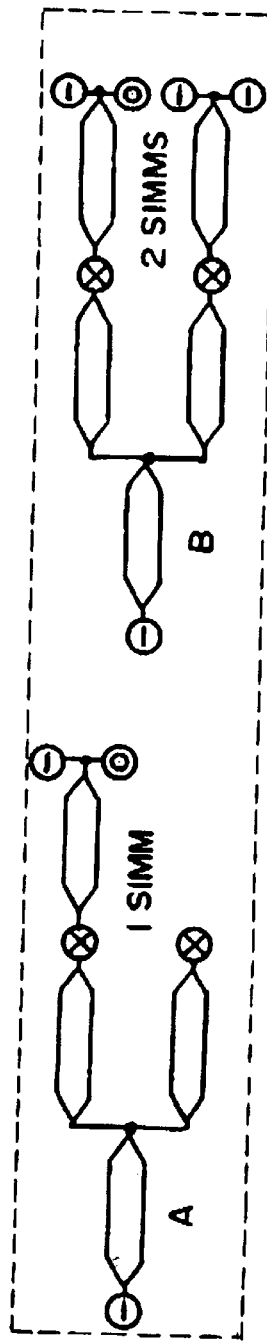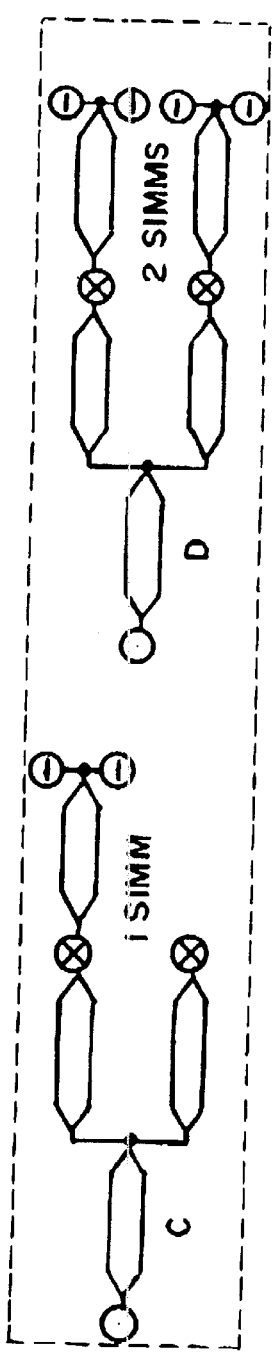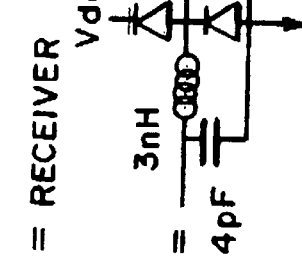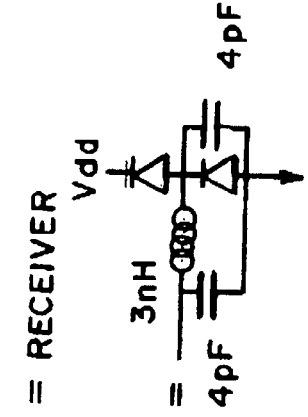
FIG. 7A
FIG. 7B

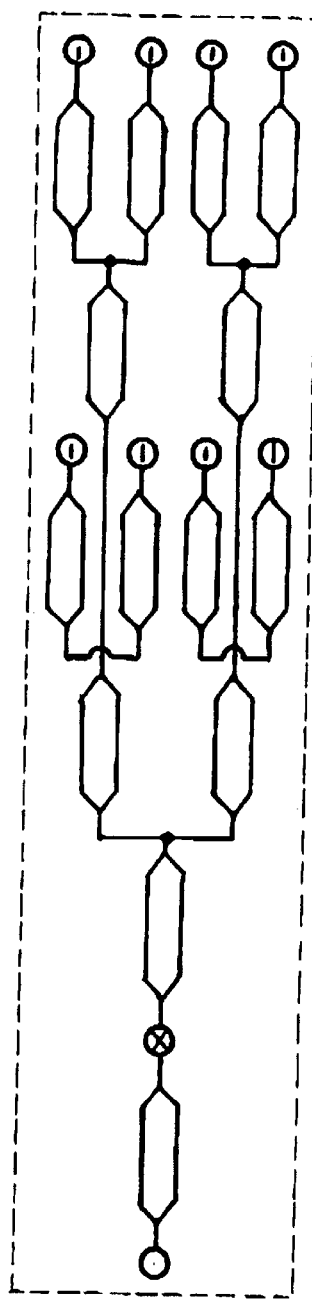
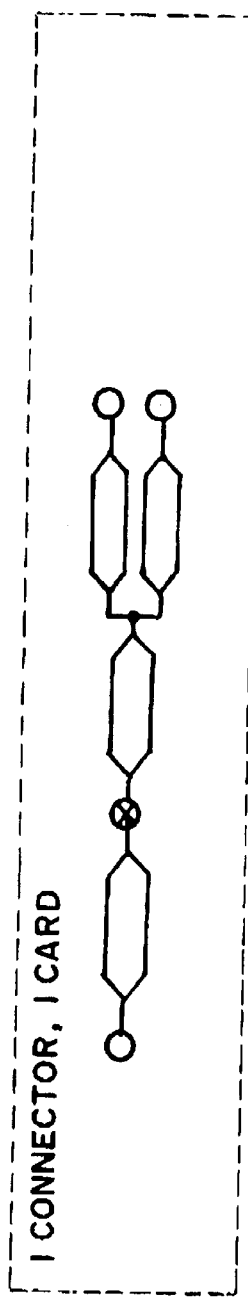
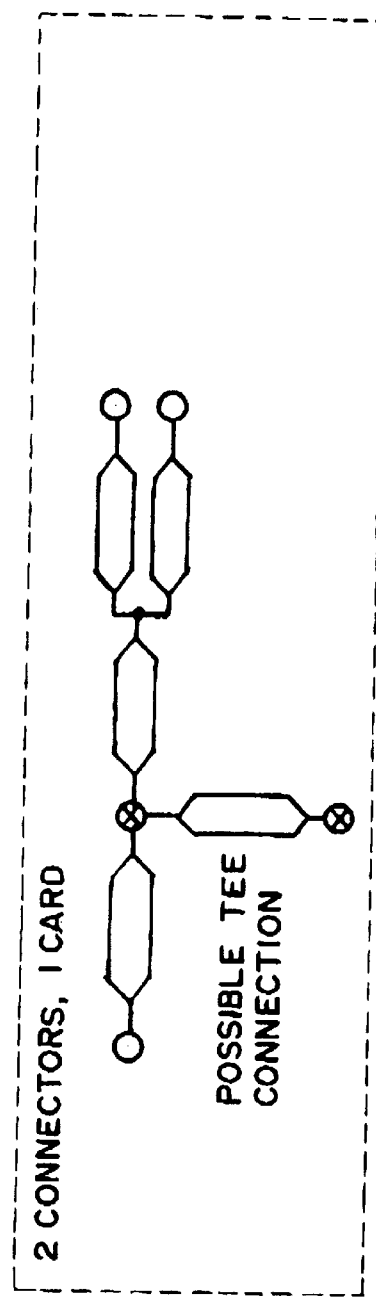
FIG.17A
FIG.17B 1 CONNECTOR, 1 CARD
FIG.17C 2 CONNECTORS, 1 CARD — POSSIBLE TEE CONNECTION

FIG.18A
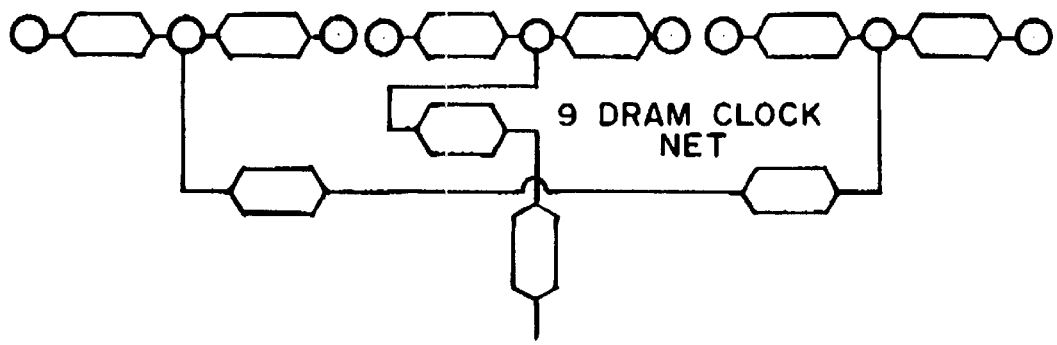
9 DRAM CLOCK NET
FIG.18B
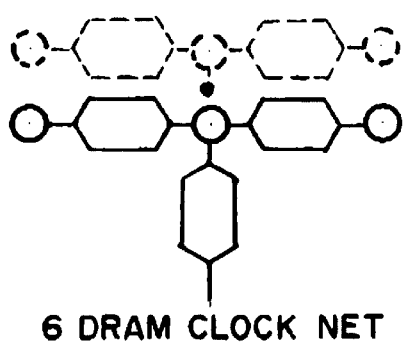
6 DRAM CLOCK NET
FIG.18C
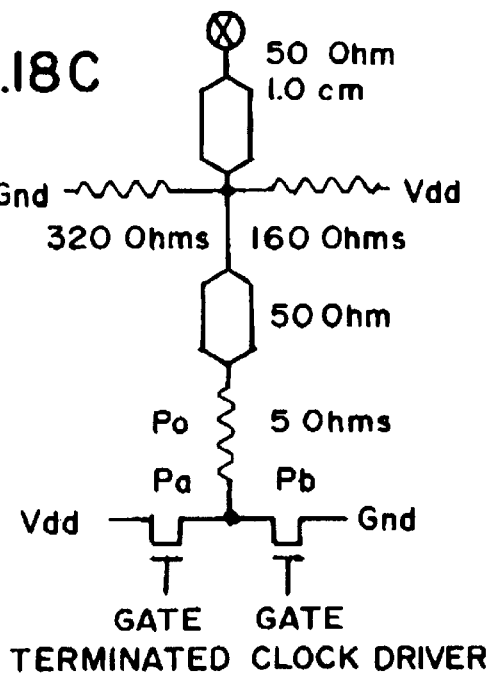
GATE TERMINATED CLOCK DRIVER
○ = RECEIVER
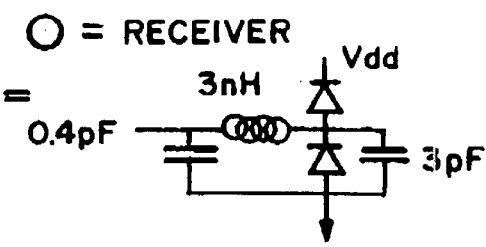
⊗ = CONNECTOR
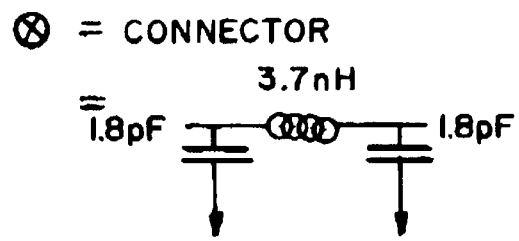

CLUSTERED, BUFFERED SIMMS AND ASSEMBLIES THEREOF

This is a continuation of application Ser. No. 08/162,745, filed Dec. 6, 1993, now abandoned.

TECHNICAL FIELD

The present invention relates to data processing systems, and more particularly to an improved method and apparatus for the arrangement and interconnection between electronic devices to improve system cycle time.

SUMMARY OF THE INVENTION

The present invention provides an arrangement between a plurality of memory storage devices and a memory control unit, which in turn connect to a data processing unit(s). The design is particularly useful for memory storage devices utilizing a synchronous interface. For the purposes of describing the invention we will refer to so called Synchronous Dynamic Random Access Memory storage devices (SDRAMs). The invention is shown in the context of a data processing system, with a data processing unit and a plurality of memory storage units, controlled by a synchronous memory and processor control unit. The said arrangement provides for high speed synchronous data transfer between the memory control unit (MCU) and the memory storage devices (SDRAMs), for frequencies of 75 MHz and higher. The said arrangement utilizes a closely packed structure, branched, balanced hierarchical circuit card wiring, and an intermediate set of buffers or registers between the MCU and the SDRAMs.

Thus coming out of the MCU is an address/control bus and a data bus. The address control bus is uni-directional, from the MCU to the SDRAMs. The data bus is bi-directional. The SDRAMs are arranged on small circuit cards called SIMMs or DIMMs (Single or Double Inline Memory Modules), in a particular configuration to be described. The SDRAMs on the SIMMs are arranged in banks. A SIMM may contain one or more banks of SDRAMs. SDRAMs in separate banks share data lines which pass through a SIMM connector into which the SIMM may be placed. In this invention we describe a SIMM with 18 SDRAMs, arranged in two banks of 9 per side, in a line. We identify 3 groups of 3 SDRAMs per side, with 3 SDRAMs in a group adjacent each other. Preferably the SDRAMs on the second side of the SIMM are so called reverse lead (from the SDRAMs on the 1st side of the SIMM), so that connections to SDRAMs on either side of the SIMM lie atop one another.

Most of the address and control signals to the SDRAMs pass through a buffer which may be optionally registered to a clock. The buffers are located adjacent to the SIMM connectors, near the center of the connector. Signal lines from the buffers preferably go to not more than 2 SIMM connectors, to minimize line loading and signal delay. The circuit card wire connections to the buffer are branched, balanced, hierarchical transmission lines which start from a single low impedance line, preferably of order 50 ohms. If there are two SIMM connectors the line preferably splits at or near the center of two adjacent connectors, into two lines of similar impedance and length. After entering the SIMM card the lines split again. In our case with 18 SDRAMs per SIMM. the line preferable splits into 3 lines of similar or higher impedance. The lines again should be of similar or equal length, and terminate with a via, described below, at the center of a group of 3 SDRAMs on either side of the SIMM. The groups of 3 adjacent SDRAMs on either side of the SIMM are connected together with high impedance transmission lines, preferably 80 ohms or higher. The two groups are connected together with the said via at or near the center of these lines.

On either side of the address/control buffers and also adjacent to the SIMM connectors are located data buffers which are preferably registered to a clock. SIMM connectors are preferably placed on either side of the row of buffers, in a symmetric fashion. The group of adjacent SIMM connectors and buffers we call a cluster. The SIMMs themselves may be present or absent from the memory system, but the buffers and connectors remain present. Only one bank of SDRAMs may place data or retrieve data from the data buffers at one time. The connections between the data buffers and the SDRAMS are also preferably branched, balanced transmission lines. For high speed operation we suggest that no more than 4 banks be connected to a single data buffer input. We will describe a set of 8 banks of SRAMs, on 4 SIMM cards. There are 2 SIMM connectors on either side of the row of buffers. To handle this case we use a 2 to 1 multiplexing, registered bi-directional buffer. This device combines two data busses, one for each set of 4 banks of SDRAMs, to a single data bus connected to the MCU. For lower speed operation a simple bi-directional registered data buffer may be used.

Certain signals, from the MCU to the SDRAMs, control which bank in a cluster is active. If, for example, there are 16 banks of SDRAMs sharing a common data bus to the MCU, then there may be 16 unique signals from the MCU, to control which bank is accessing the data bus. Buffers, preferably registered, for these bank select (BS) signals are located preferably in the center of the clusters. Signals from these buffers then go to the chip-select (CS) inputs of the SDRAMs, again in a branched, balanced, hierarchical fashion as described for the address/control signals to the SDRAMs.

The SDRAMs, registers, and MCU are synchronized to a block. The distribution of this reference clock to the many SDRAMs, which may be present or absent, is a problem we address. In our preferred embodiment two groups of 3 SDRAMs on opposite of the a SIMM are connected together, in a fashion similar to one of the 3 legs of the address/control net of a SIMM. We also show a second arrangement of 9 SDRAMs, all on one side of a SIMM, connected to a single clock in a manner similar to the bank select line. These clock signals are preferably terminated with resistive connections to power and ground, with resistors located as close as possible to the SIMM connectors. In our preferred embodiment they are located between the data buffers and the SIMM connectors. This arrangement allows for all components to be mounted on the same side of the base circuit card that contains the SIMM connectors.

It is therefore an object of the present invention to provide an arrangement of a plurality of memory storage devices, a set of intermediate buffers or registers, and a memory control unit, to allow for high speed synchronous transfer of data between the memory control unit and the memory storage devices.

It is yet another object of the invention to provide an arrangement for one or more data processing units which also interface through the memory control unit, and to each other through a processor control unit.

It is yet another object of the invention to provide improved signal quality in the system.

It is yet another object of the invention to reduce the disturbance to the signal quality of the as the number of memory storage devices is varied.

It is yet another object of the invention to minimize the number of intermediate buffers in a fully populated system.

It is yet another object of the invention to provide for high speed transfer to a large number of memory storage devices.

These, and other, objects and advantages of the present invention will now be described, with reference to the following drawings, in which:

BRIEF DESCRIPTION OF THE DRAWINGS

FIGS. 5 and 6 show a preferred pinout for the said SIMM connector.

FIG. 7 shows a preferred topological arrangement of data buffers, transmission lines, and SDRAM data I/O.

FIG. 18 shows a preferred topological arrangement of a clock driver and either 6 or 9 SDRAMs.

DETAILED DESCRIPTION OF THE PREFERRED EMBODIMENT

Figure 1:
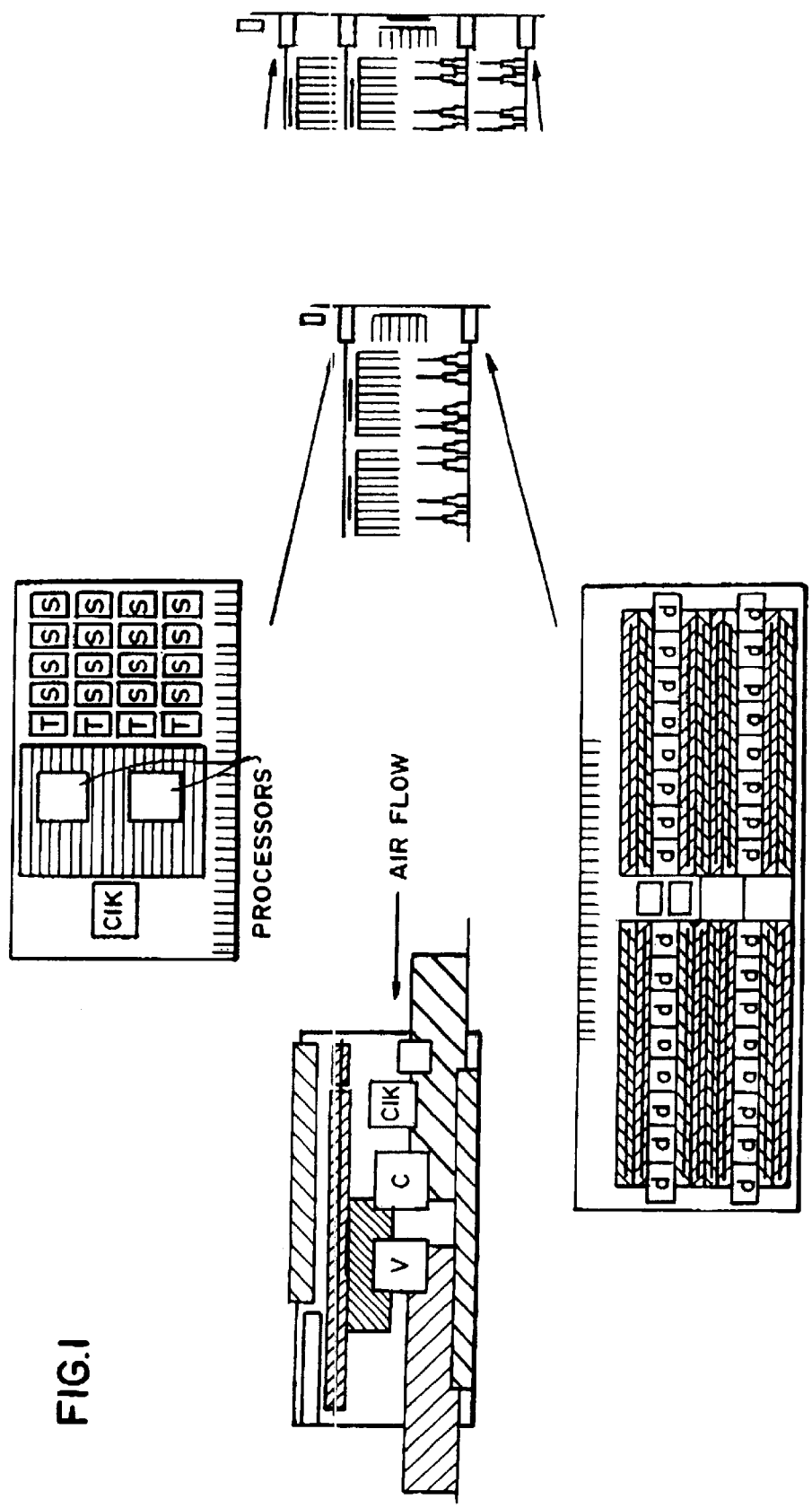
FIG. 1 shows a synchronous memory-processor complex with one or more processors on a single circuit card, a memory/processor control unit, and a single memory card.

FIG. 1 shows a processor memory complex. The data processing and its associated local cache memory is shown on a single CPU circuit card. There are 2 processors, one above the other, for improved cooling. A clock on the card synchronized communication on the card, and also communication to a memory-processor control unit located on a CPU planar which accepts the processor card. The chip marked C contains primarily address and control function and the chip marked V contains primarily data function. The processor contains circuitry to synchronize the local clock to the other clocks in the system. The CPU planar also shows a memory card, which contains synchronous memory storage devices (SDRAMs). There is a clock on the memory card to synchronize communication between the memory control unit (MCU) and the SDRAMs. There is also circuitry, shown as a phase locked loop chip (PLL), to synchronize the clock on the memory card to the master clock on the CPU planar. The PLL may be integrated into the memory card clock. Also shown on the memory card are data registers, marked with a (d), for buffering data to and from the SDRAMs and MCU. Also shown on the memory card are address buffers which may be optionally registered, marked with an (a), for buffering signals from the MCU to the SDRAMs. A single address/control bus from the MCU drives all address buffers on the memory card. This is shown schematically in FIG. 18. The memory cards and CPU cards are shown facing each other and centered around the interface control chips. This is to reduce net length, provide a compact package, and allow for efficient cooling. A power connector on the CPU planar provides a low inductance path for DC voltage to be supplied from a nearby power supply, not shown. Also shown is an I/O connector, for connection to an adjacent circuit card which provides communication to the processor-memory controller (and thus to the CPU and SRAMs themselves), and peripheral devices like printers, terminals, displays, etc. An oscillator (osc) feeds the master clock on the CPU planar. Thus what we have shown is a compact organization of 1 or 2 CPU's and local cache, a large number of SDRAM memory devices, and a processor-memory control unit. Identified is a synchronized clock structure, DC power supply, connection to peripheral devices, and cooling. Processor and memory cards are pluggable and changeable.

Figure 2:
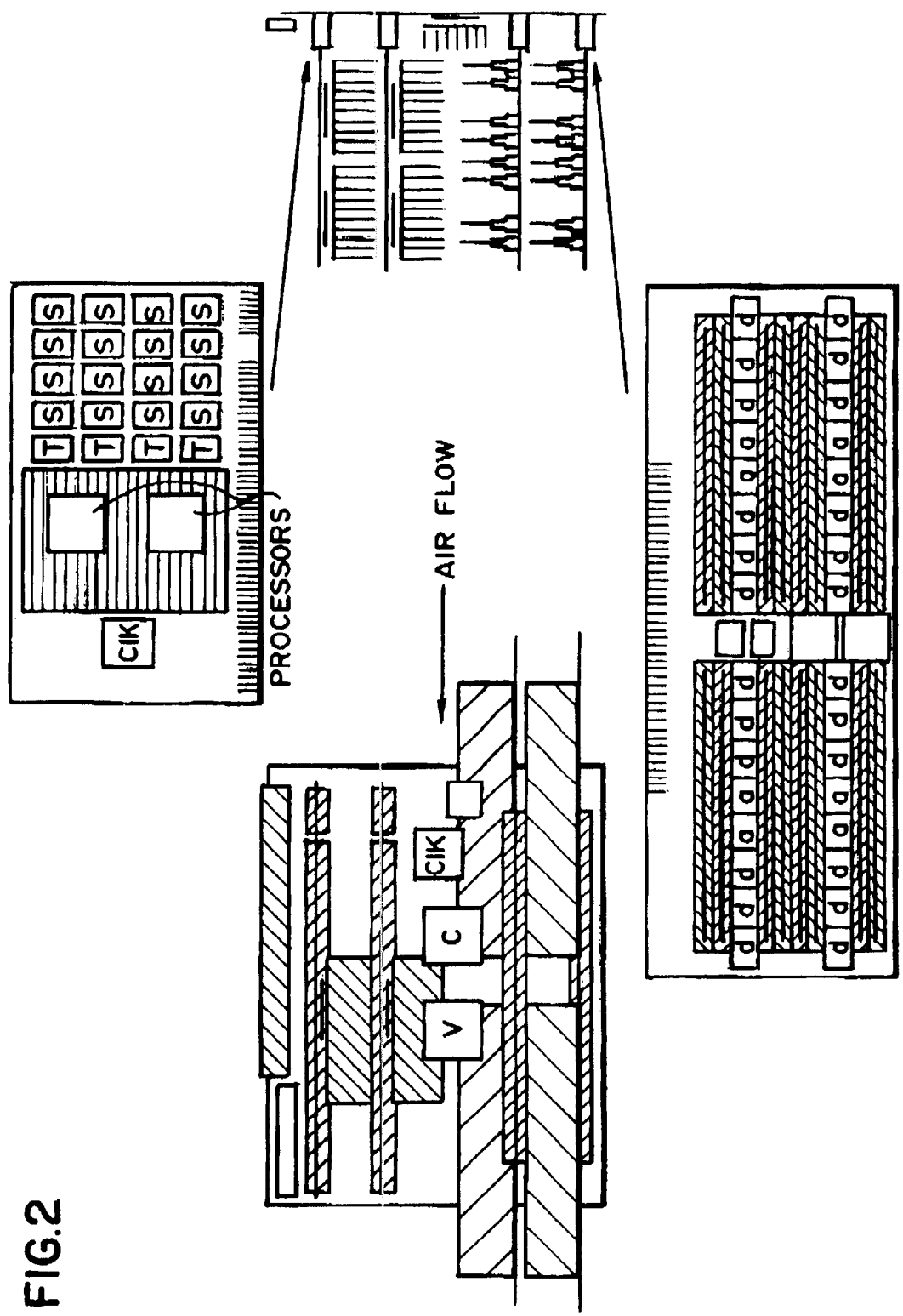
FIG. 2 shows a synchronous memory-processor complex with two said processor card, two said memory cards, and a memory/processor control unit.

FIG. 2 extends the structure of FIG. 1 to multiple processor cards and multiple memory cards. Again the compact structure is preserved. The net length to the most distant elements is reduced from that of a design with all elements on single circuit card, by virtue of the 3-dimensional geometry. FIG. 18 shows schematically how a single data bus from the MCU is connected to 2 memory cards. Separate address/control busses go from the MCU to each of the memory cards. This allows the bank select signals, shown in FIG. 12, to be shared between the two memory cards. Thus what we have shown is a compact 1–4 processor bus-based processor-memory complex. As we shall show by simulation, the cycle time of this system should exceed 75 MHz. The system of FIG. 1 should run faster still.

Figure 3:
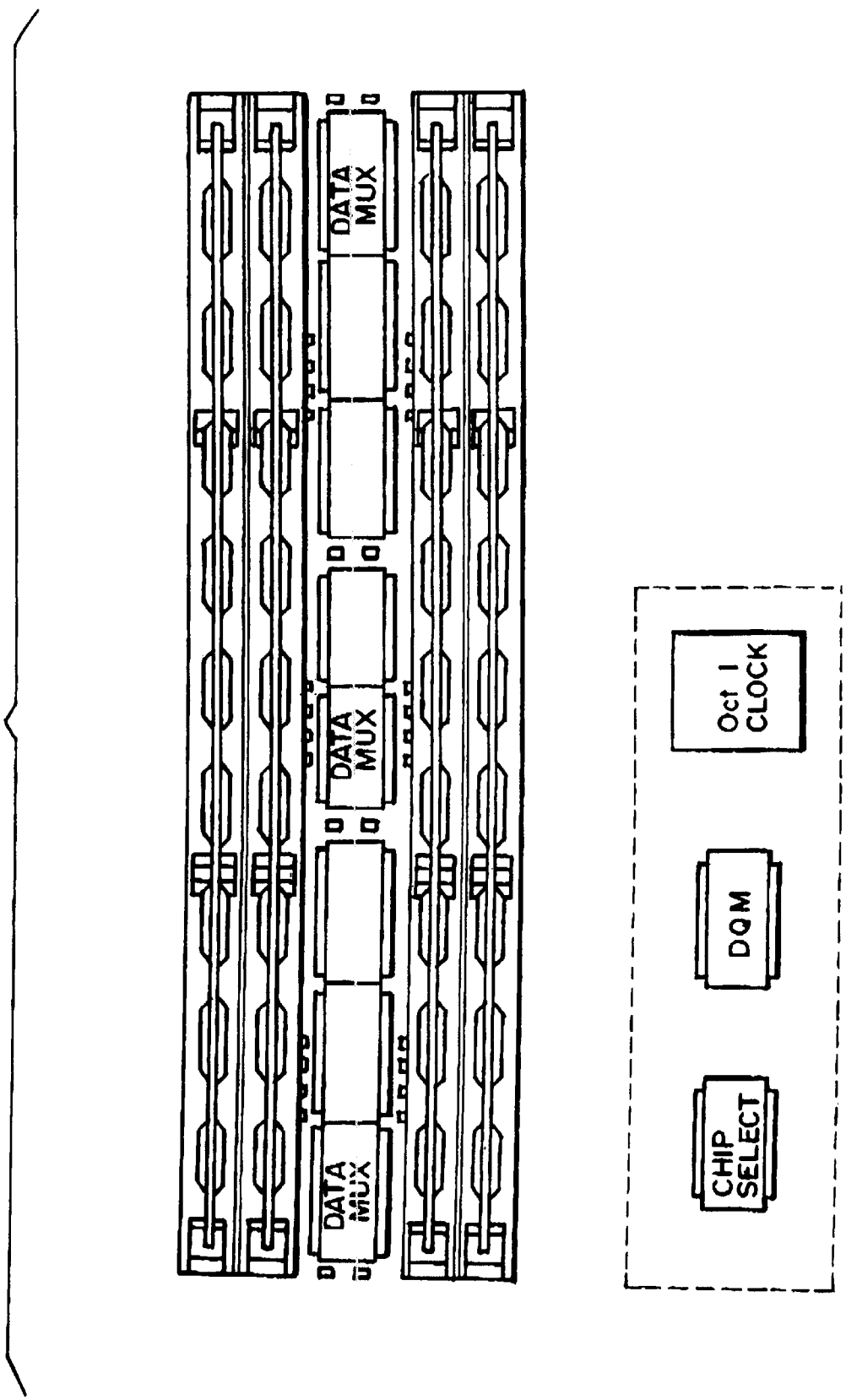
FIG. 3 shows a top view of a section of the said memory card, called a cluster. The SIMM connectors in the cluster are shown with small circuit cards called SIMMs, upon which are located synchronous memory devices called SDRAMs.
Figure 4A:
FIG. 4 show a front view and top view of one of the said SDRAM SIMMs, in its connector.
Figure 4B:
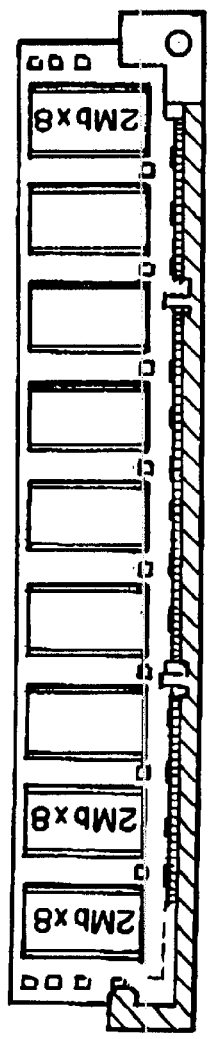
Figure 4C:
Figure 4D:
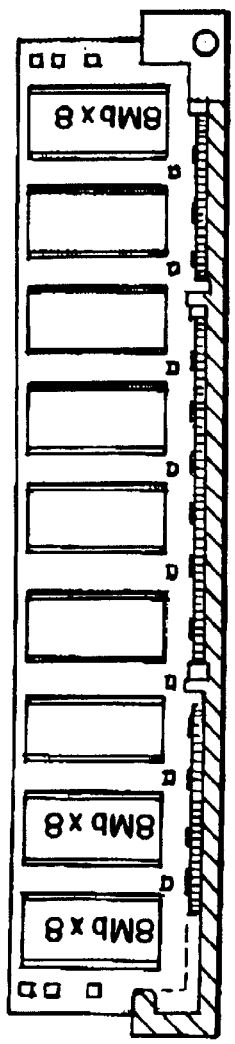

FIG. 3 shows a closeup of ¼ of the SDRAMs and buffer/registers on the memory card of FIG. 1. This small cluster of 4 SIMM cards is a basic building block. All signals connecting the MCU to the SDRAMs, except possibly for the PD enable signal to be described later, pass through buffers or registers. Before describing these signals in detail it is informative to refer to FIGS. 4, 5 and 6.

In FIG. 4 is shown a front a top view of a small memory card, commonly called a SIMM or DIMM for Single or Dual Inline Memory Card, upon which are located a number of SDRAMs. The SDRAMs are preferable spaced evenly. Between and below the SDRAMs are located decoupling capacitors. Space is allowed for two sizes of SDRAMs. SDRAMs can be located on both sides of the circuit card. SDRAMs on opposite sides of the card are preferably arranged so that common signal pins lie above one another, for ease of connecting them together.

Slots in the circuit mate with keys in the circuit card connector, arranged to that the card fits the connector only one way. Notches in the side of the card are preferably available so that a combination of card ejector and positive latch may engage the card as it is inserted. Preferably this card ejector/latch is contained primarily within the volume of the connector end-pieces which also stabilize the card in the connector. Only a small portion of the card ejector need extend outside the connector end-pieces, so that pressure may be exerted to ejects the card.

In the space above the connector end-pieces are preferably located additional power plane decoupling capacitors and small transistors (FETs). The FETs are arranged so that the gate control is in common, and brought to the card edge. This is signal pin 1B, PDE, of FIG. 5. One other end (source or drain, depending) of all FETs is brought to a reference voltage, preferably ground. The last signal of each FET is brought to an individual pin on the connector (PD0-7 on FIG. 5 and 6). The purpose of the PD (Physical Description) signals is to allow a code to be placed on each SIMM. The code is made by placing and enabling a FET, as opposed to the absence of the FET on an enabled SIMM. The purpose of the enable is so that many SIMMs may share the same PD line, with only a PDE signal to selectively enable each SIMM in turn.

FIGS. 5 and 6 show the preferred pin assignments for the electrical connection between the SIMM card edge and the connector of FIG. 4. The pin assignments are chosen to a) minimize the wire lengths of the signals to and from the SIMMs; b) augment the preferred wiring topologies involving the SIMMs and SDRAMs located on them as shown in FIGS. 7, 12, 14, and 19; c) allow for good signal isolation, especially for critical signals like the clock and chip select; d) allow for expansion for alternative SIMM designs with increased number of data bits, etc. Thus the address lines are located in the center. The order of the address pins match closely the order of the address signal pins on the SDRAM modules, so as to allow easy wiring of the net topology of FIG. 14. The SDRAMs themselves are arranged vertically and with the data pins of the SDRAM close to the connector, to minimize data line wire length as shown in FIG. 7. The clock pins on the SIMM match the topology of FIG. 19. Besides lying directly under the clock pin of the center group of 3 adjacent SDRAMs, all clock pins are on the same side of the connector. This allows for a variation of FIG. 3 whereby the 2 SIMMs below the row of buffer/registers are rotated 180 degrees with respect to the SIMMs above the row of buffer/registers. In this manner the distance between the clock termination resistors shown in FIG. 4 and the SRAMs on the clock line may be minimized.

There are 2 chip select lines (CS0 and CS1). In principle there can be more. These control banks on SDRAMs. In FIG. 4 we show the use of x8 SDRAMs, with 8 data pins per SDRAM. Thus 9 SDRAMs provide the 72 data pins shown in FIGS. 5 and 6. The other 9 SDRAMs are connected to the same 72 data bits, as shown in FIG. 7. The connection may be made with a via, since the pins on the SDRAMs on different banks lie on top of each other. It is also possible to use x4 SDRAMs, with 4 data I/O. In this case all 18 modules are required to get 72 bits, and the data lines all distinct, and there is only one CS line. Similarly we could use x16 SDRAMs, with 4 banks. In this case the RFU signals (reserved for future use) on FIGS. 5 and 6 could be used for the 2 more requisite CS lines.

Also shown in FIG. 6 is a signal labeled Insd. This is for Installed. It is a pin connected to a reference line, preferably ground. It may be used to control the enabling/disabling of the buffer/registers of FIG. 4. For example, the lnsd lines of all SIMM of FIG. 4 may be connected together, and to the enable line of all the buffers. If any one SIMM is actually installed, the buffers are enabled (they work), otherwise they do not function. This saves power and reduces electrical noise caused by unterminated signals.

The large number of reference pins (36 power, 36 ground), allow for good signal isolation. All signals have at least one reference line adjacent. Critical signals like the clock lines have both power and ground pins adjacent. Reference lines on one side of the card are offset from lines on the other side, so further isolate signals as they enter the circuit card.

We can now refer back to FIG. 3. One of the two address buffers are connected to all SDRAMs on the 2 SIMMs above it , and the other to all SIMMs on the 2 SIMMs below it. FIG. 14 shows our preferred method of wiring. If single cycle control of the address lines is required than the address buffers should be registered, and controlled with the same system clock as the SDRAMs. Otherwise they can be simple buffers, and the address pulse held valid for 2 cycles by the MCU.

Figure 9:
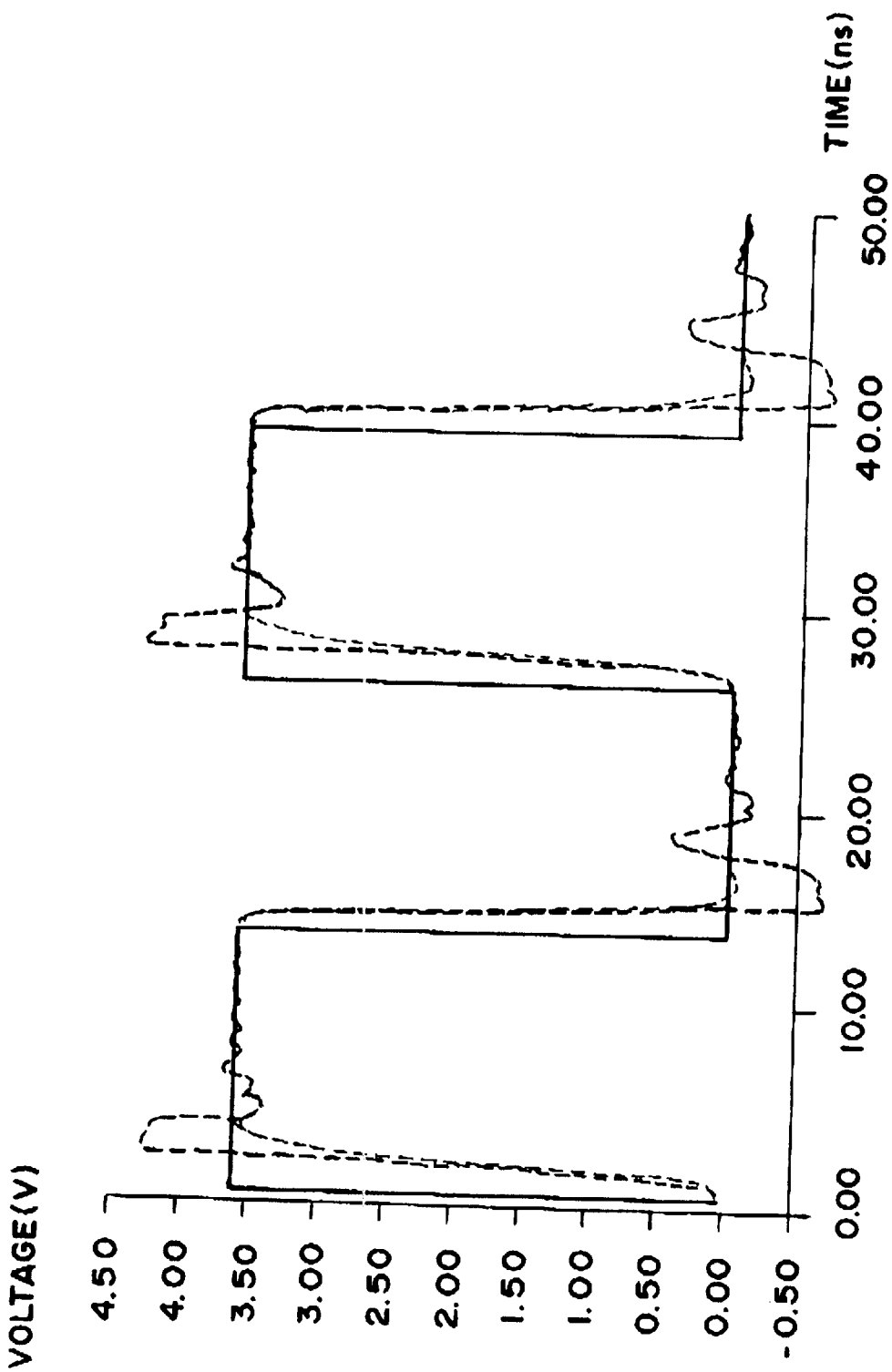
FIG. 9 shows a simulation of a data pulse at the data buffer, during an SDRAM write with 1 SIMM installed in a cluster.
Figure 10:
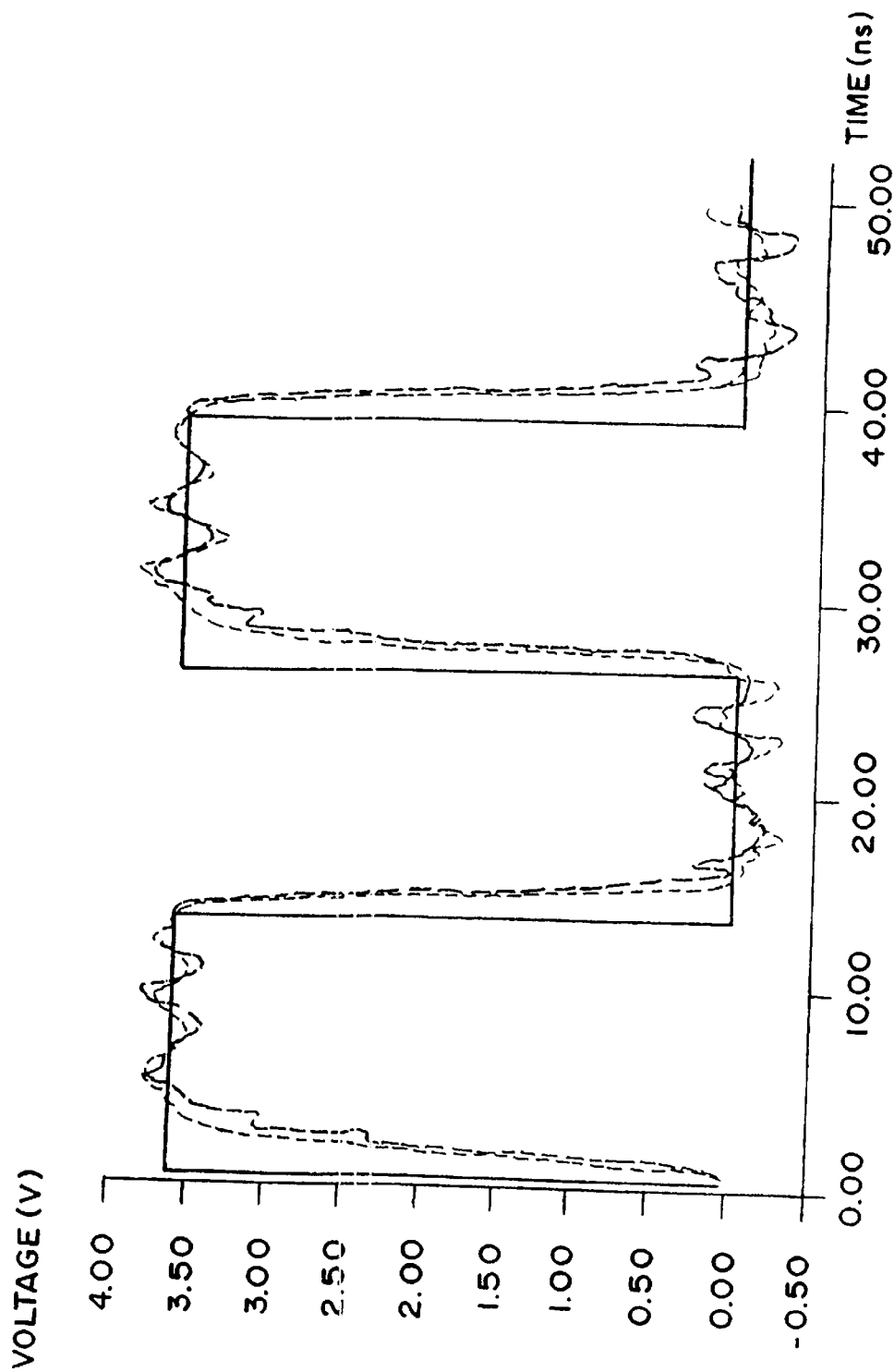
FIG. 10 shows a simulation of a data pulse at the data buffer, during an SDRAM write with 2 SIMM installed on the same side of a cluster.

The 2-1 data muxes of FIG. 3 are recommended for high data rate. This is demonstrated by the simulation waveform of FIG. 8, as explained below. In this case one of the 2 mux inputs in connected to the data lines of the 2 SIMMs above it, and the other to the data lines of the 2 SIMMs below it. In the figure there are 72 data connections to be made, so each mux combines two 12 bit data busses into one 12 bit data bus which in turn connects to the MCU. The muxes are registered. Data read from the SDRAMs is almost immediately valid at the input to the muxes (FIG. 8), and can be clocked with the SDRAM system clock, with perhaps a small compensation in delay required to center the data on the clock. Similarly data may be written from the muxes to the SDRAMs with little delay (FIGS. 9 and 10). Data to all 8 SDRAMs with common data in FIG. 3 may be written from a single data buffer, owing to the register, however, this is not in our preferred embodiment.

FIG. 7 shows our preferred connection between the data muxes and the SDRAMs of FIG. 3. FIG. 7A described an SDRAM read (data is coming from the SDRAM), for a case with only one SIMM installed in the pair of connectors above the data mux of FIG. 3. The impedance of these short lines is not critical, but typically the memory card would use 50 ohm wiring while the outer surface of the SIMM, which may contain the data lines, would have a higher impedance of 90 ohms or so. We prefer to connect to the 2 SIMM connectors with a tee connection, as shown. If both SIMM are installed then the net looks like FIG. 7B.

Figure 8:
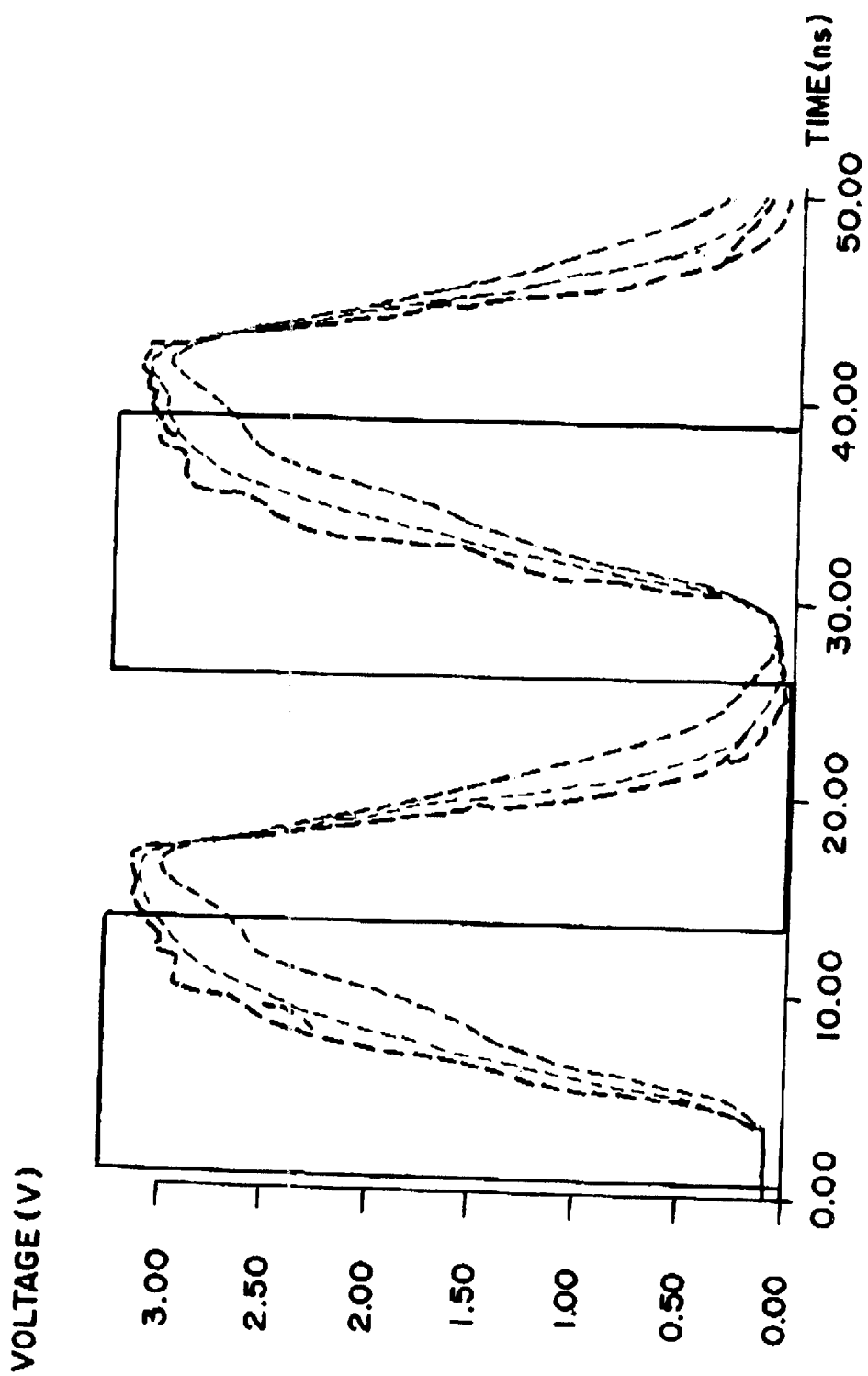
FIG. 8 shows a simulation of a data pulse at the data buffer, during an SDRAM read.

FIG. 8 shows a simulation of the resultant waveform. For reference we show the data signal out of the SDRAM, into a 30 pico-farad (pF) capacitive load. This is the usual test load for the device, upon which the manufacturer bases the performance of the SDRAM. To the left of this pulse, i.e., early times, as the data pulse as sampled at the input to the data buffer for the cases of FIG. 7A and 7B. The conclusion is that the data buffers are less load than the test load, so they do not effect the design performance of the SDRAM. However, if all 4 SIMM of FIG. 3 are connected together with symmetric wiring, the pulse labelled "8 loads" results. Since in principle 1 SIMM or 4 may be plugged in, the data valid window has to span all cases. Measured at 1.5 volts it is about 2 ns, about ½ of the hold time of the pulse. We do not recommend running a high speed system with 8 data loads, although slower speed systems could do so.

Figure 11:
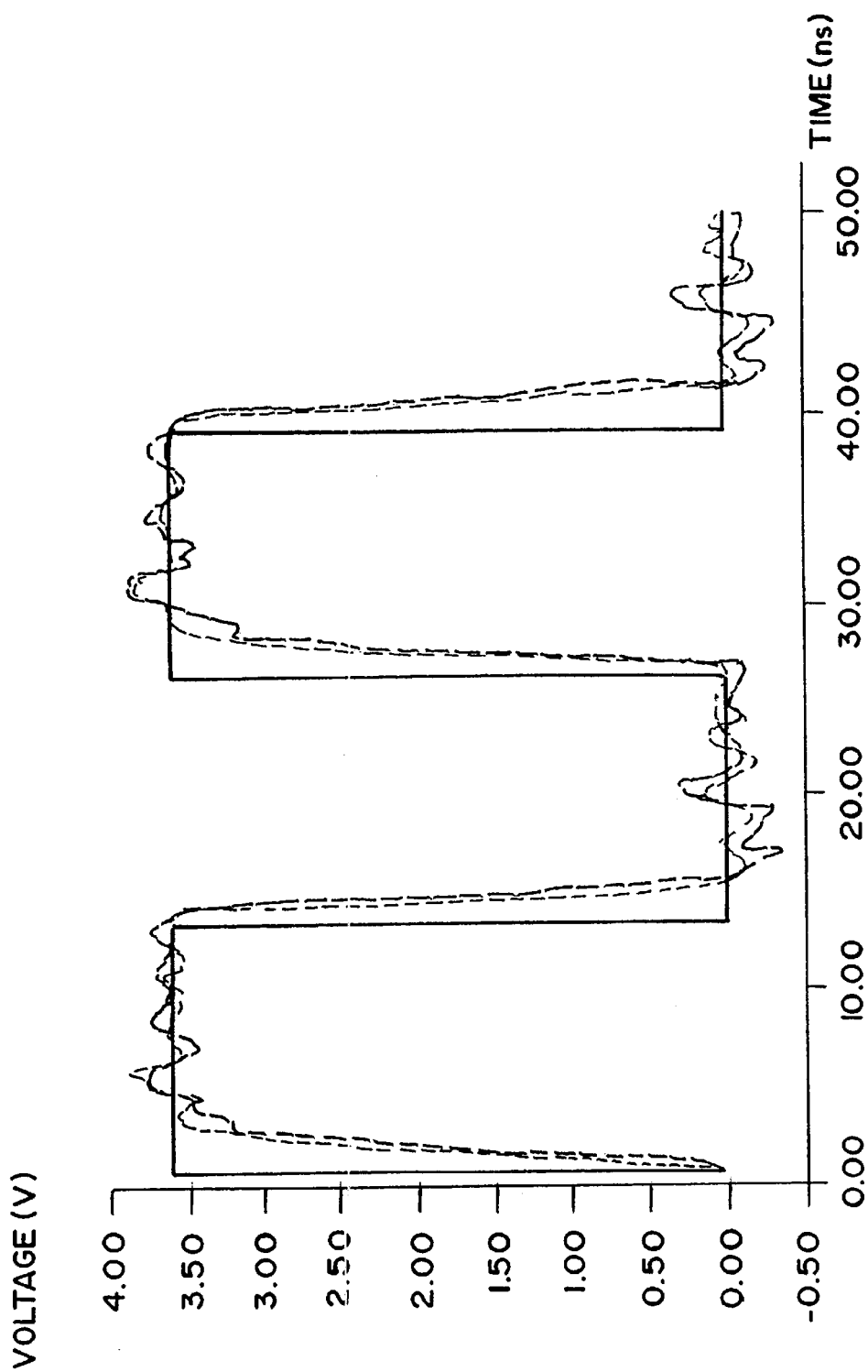
FIG. 11 shows a simulation of a data pulse at the data buffer, during an SDRAM write with 4 SIMM installed in a cluster, and all SIMM connected to a single data register channel.

If the data buffer is writing to the SDRAMs then the schematics of FIG. 7C and 7D apply. The result pulses at the SDRAMs are shown in FIGS. 9 and 10. There is little pulse distortion. Even the case of 8 loads, FIG. 11, is acceptable. This is a direct result of the short wire lengths of FIG. 7, and the net topology. SDRAM data buffers are relatively slow, and meant to drive long, high capacitance nets. This is shown directly in the test load of FIG. 8. They drive the short, although asymmetric from the point of view of the SDRAM, data nets of FIG. 7 easily. On the other hand the data drivers are typically very fast, high slew rate, low impedance drivers. Again this is shown directly in the test load case of FIGS. 9–11. The short, balanced nets of FIG. 7 are very effective in suppressing the usual ringing and signal distortion that accompany use of the these drivers.

Multiple clusters of SIMMs (FIG. 3) may be combined. The memory card of FIG.1 has 4 clusters, in 2 sets. Within a set the 12 output data bits from the muxes are themselves combined, to make a single bus to the MCU. Both sets have a common connection between the address buffers and the MCU. They may also be combined across memory cards. In FIG. 2 there is a single data bus between all data muxes and the MCU The preferred wiring of multiple clusters in shown in FIG. 18. Because data from the MCU may be made valid for the entire sample and registered into the data muxes (and vice-versa), even the 8 cluster data bus of FIGS. 2 and 18 may be run at 75 MHz.

Figure 12:
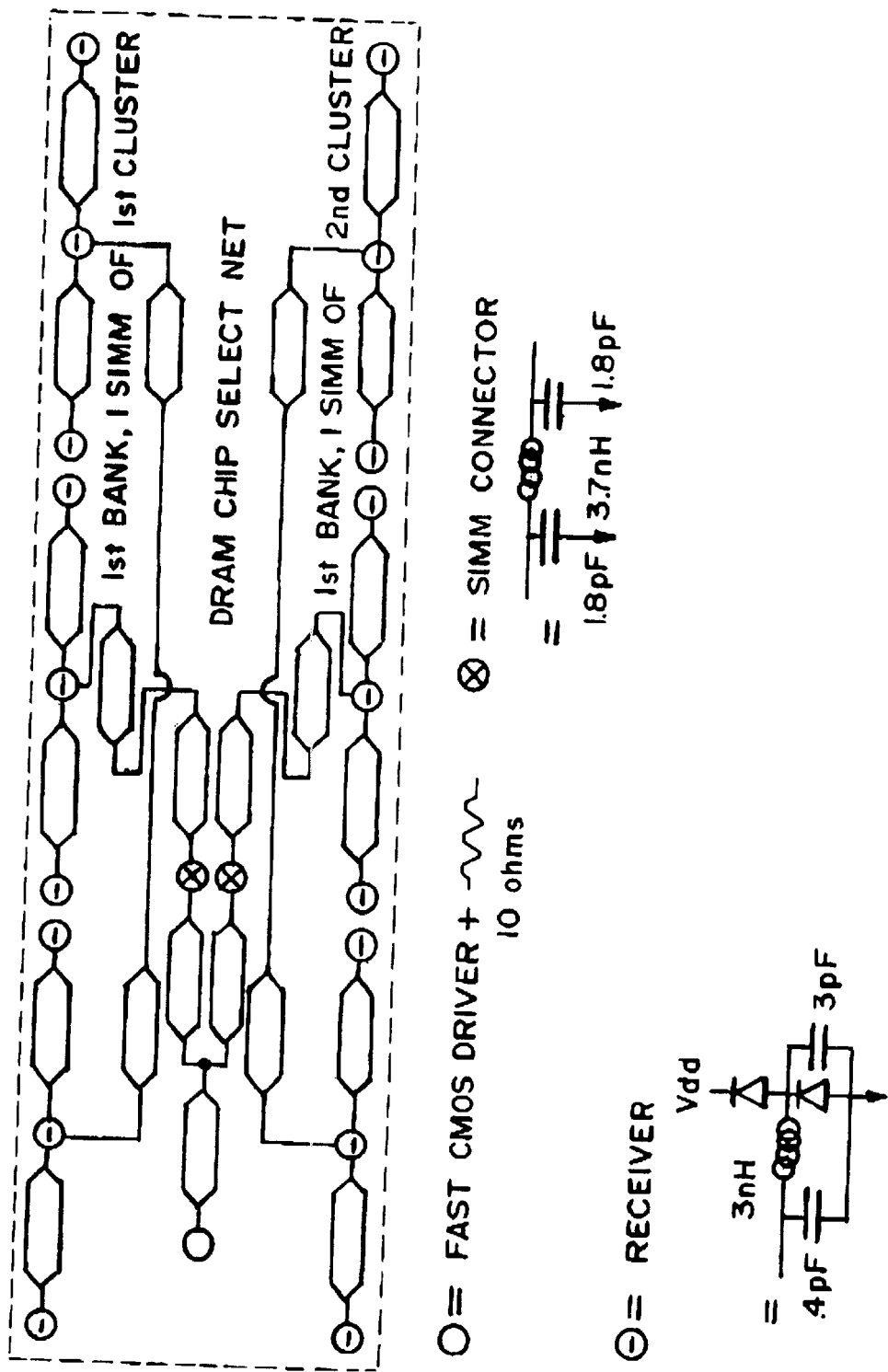
FIG. 12 shows a preferred topological arrangement of chip select (bank select) buffers, transmission lines, and SDRAM chip select receivers.

FIG. 12 shows a preferred topological arrangement of chip select (bank select) buffers, transmission lines, and SDRAM chip select (CS) receivers. The transmission line impedances and lengths are appropriate for the memory card of FIG. 1. Since we are describing 2 bank SDRAM SIMMs, the CS buffer must select just one bank. Thus we connect all chips on the front side of the SIMM together, and all SIMM of the back side together. Wiring to the SDRAMs themselves is on the outer plane of the SIMM and is naturally high impedance, as we recommend. The equal length wiring that connects the groups of 3 SDRAMs is on an internal signal layer of the card, and is naturally lower impedance as we recommend. The final connecting leg between the 3 way split and the connector is also low impedance, and preferably matches the more typical 50 ohm impedance of the memory card. This can be accomplished with a 4th wiring plane. In our preferred embodiment we suggest a 3s/3p structure arranged as signal, ground, signal, signal/power, ground, signal. The hybrid signal/power plane contains the wiring from the edge connector to the 3 way split.

Since the net length to all SRAMs is approximately the same, all chips see there signals at nearly the same time. This is also a good clock net, and in fact appears as one of the two clock nets of FIG. 18. Since this CS net applies to the memory card of FIG. 1, SIMM on both the left and right sides of the card need to be selected together. This is the reason for having 18 loads, on 2 SIMMs, on this net. If only 9 loads on 1 SIMM are on a chip select net, it is likely that termination resistors as described in FIG. 18 are required to prevent excessive ringing. These termination resistors could be placed on the SIMM, since the CS lines are not used if the SIMM is not present.

Figure 13:
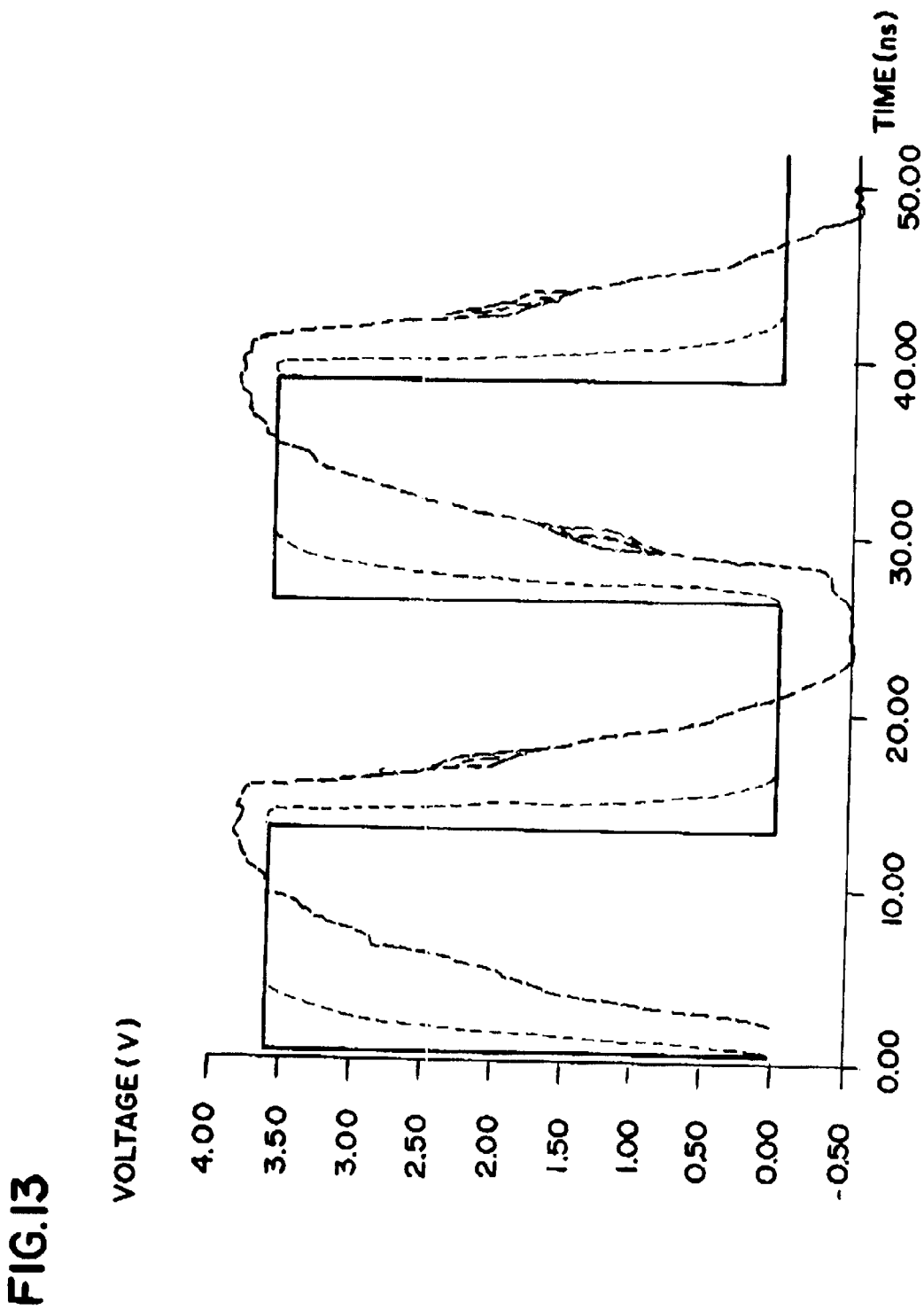
FIG. 13 shows a simulation of a chip select pulse at a selected SDRAM.

FIG. 13 shows the resultant simulated waveform as measured at the SDRAM. There are two unique position for the SDRAMs, and both are shown. As expected they are very similar. This signal could probably be run faster (100 MHz) without difficulty, even though it is a single cycle signal.

Figure 14A:
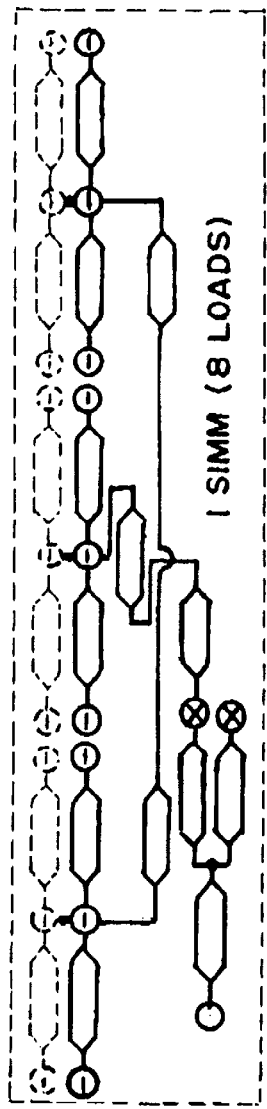
FIG. 14 shows a preferred topological arrangement of address/control buffers, transmission lines, and SDRAM address/control receivers.
Figure 14B:
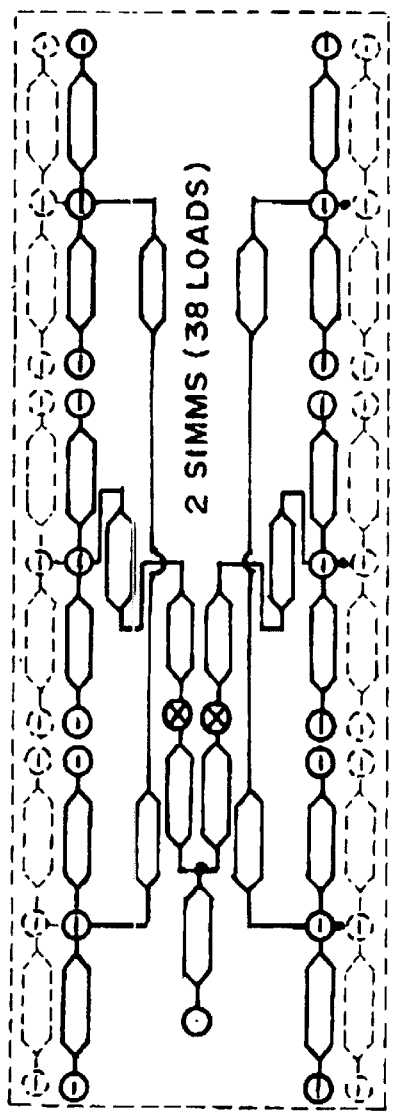
Figure 15:
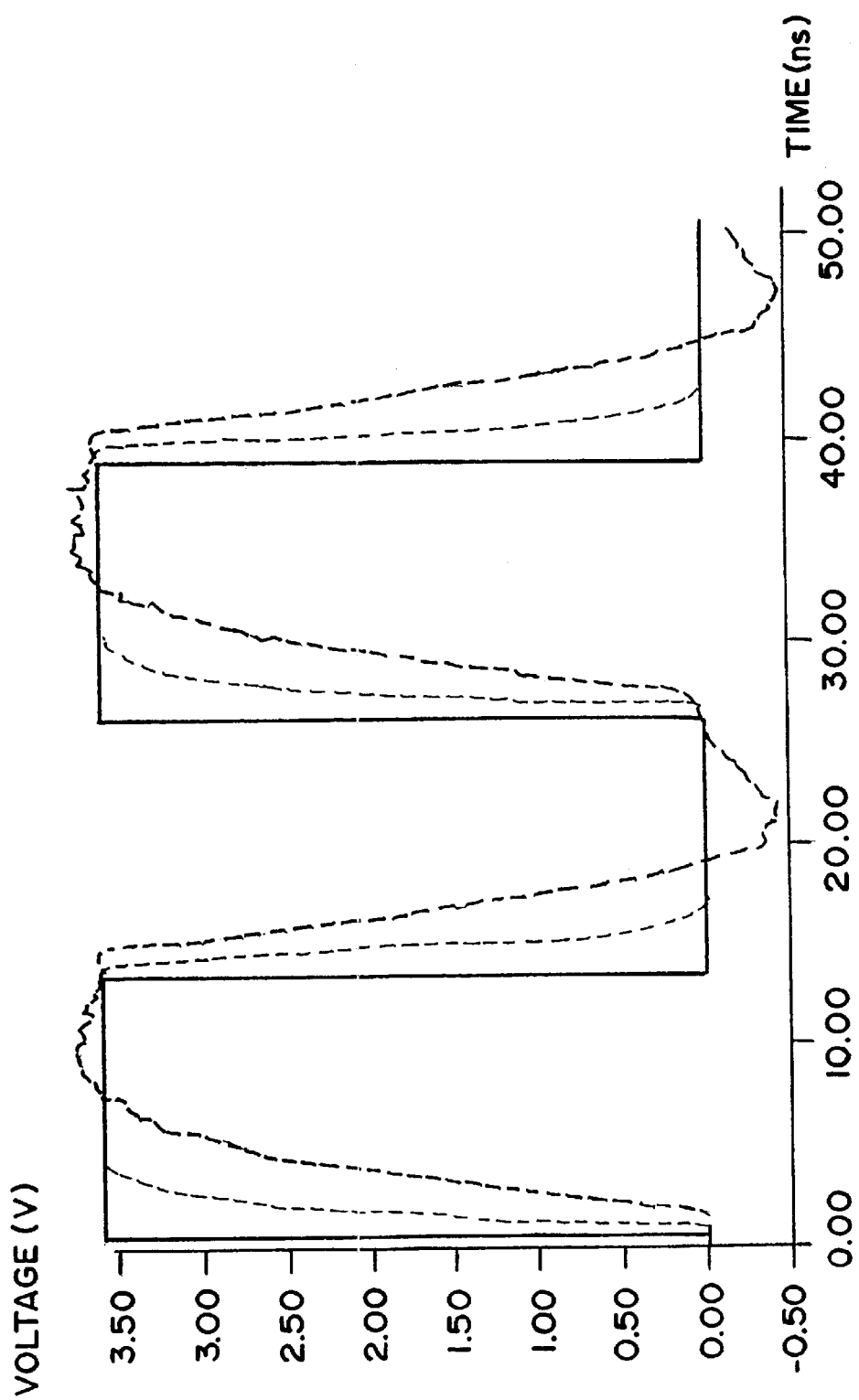
FIG. 15 shows a simulation of an address pulse train at a addressed SDRAM, with 1 SIMM installed on one side of a cluster.
Figure 16:
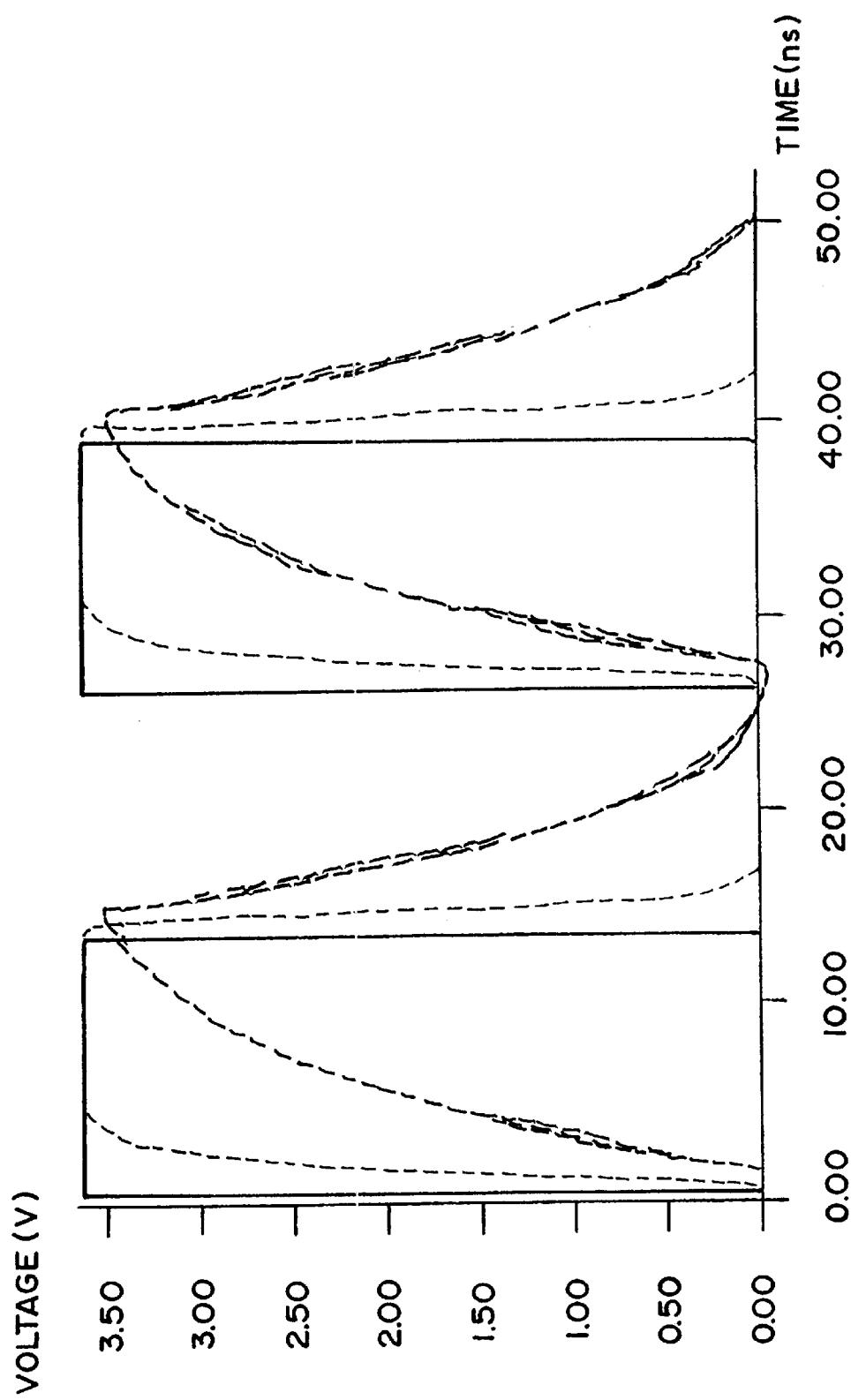
FIG. 16 shows a simulation of an address pulse train at a addressed SDRAM, with 2 SIMM's installed on one side of a cluster, and connected to a common address buffer.

To economize of the number of buffers and to make a compact system, signals which need only be valid after 2 cycles have more SRAMs assigned to them. FIG. 14 shows a preferred topological arrangement of address/control buffers, transmission lines, and SDRAM address/control receivers. It follows closely from the CS nets. This time SDRAMs on both the front and back surface are connected together, and the center of a group of 3 SDRAMs. This is our preferred topology, and can be accomplished with the same via that connects the top surface wiring to the internal surface. Again the impedance and wire lengths correspond to the memory card of FIG. 1. FIG. 15 shows the resultant address pulse measured at the SDRAMs, for the 2 unique SDRAM positions, for the case of 1 SIMM installed (FIG. 14A). FIG. 16 shows a simulation of the same pulse for the case described by FIG. 14B, that is, 2 SIMM installed on the same side of the address buffers of FIG. 3. This time the pulse is strongly distorted, but the distortions are very smooth. Since this is a two cycle pulse there is considerable timing margin. For very high speed application the address buffers can be registered and operation at 100 MHz is clearly acceptable. For operation at 75 MHz, the address buffers need not be registered and the address pulse from the MCU help valid for 2 cycles. This saves signals, clock lines, etc.

Figure 17D:
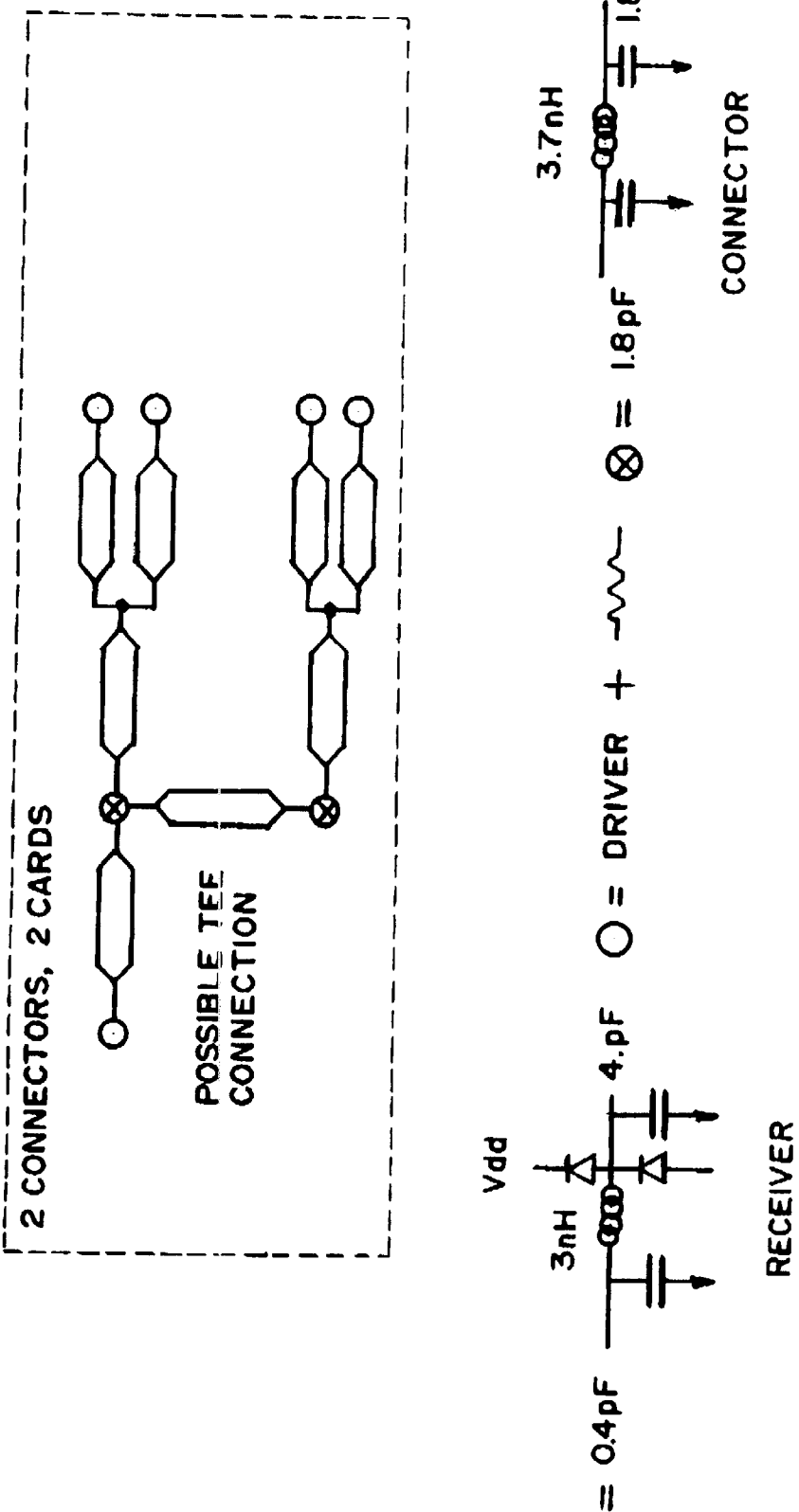
FIG. 17 shows a preferred topological arrangement of the memory address control unit and the address/control buffers. Also shown is a preferred topological arrangement or a memory data control unit and the SDRAM data registers.

FIG. 17 extend our referred topological arrangement of devices, connectors, and transmission lines to the interface between the ACU and the buffers. In FIGS. 1 and 2 the memory and control signals to the memory card come primarily from the chip marked (C). Since there is a unique address bus for each memory card, FIG. 17A applies for both FIGS. 1 and 2. Again impedances and transmission line lengths correspond to the memory card of FIG. 1. Also shown in FIG. 17B is our preferred method of connecting the data portion of the memory control chip (V of FIG. 1) with the data mux chips of FIG. 3. These are bi-directional nets and so must be kept short. Since both the data buffers and the MCU may utilize high slew rate, low impedance drivers, the net lengths should be kept as short as possible. Low impedance wiring reduces signal distortion. If multiple data cards share the same data bus as in FIG. 2, then the wiring of FIG. 17C and 17D applies. In this case the two memory cards should as close as possible to each other. A possible alternative geometry to FIG. 2 is to place the two memory cards back to back, so as to move their connectors together. The cards must be designed so that data busses may be connected in the manner, or the MCU must be configured so as to allow this interconnection.

Figure 19:
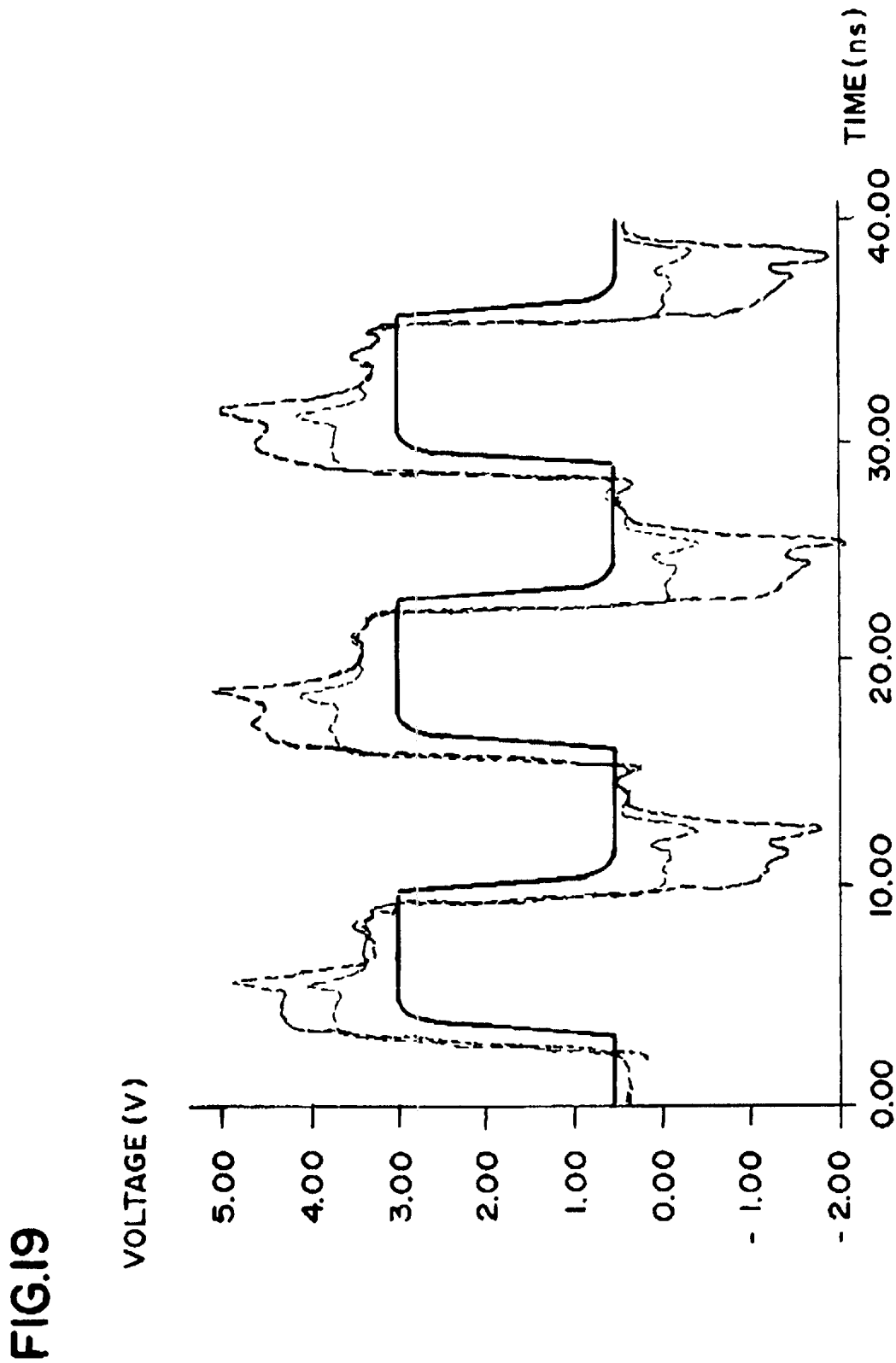
FIG. 19 shows a simulation of a clock line with a SIMM absent from its connector, with and without resistive termination.
Figure 20:
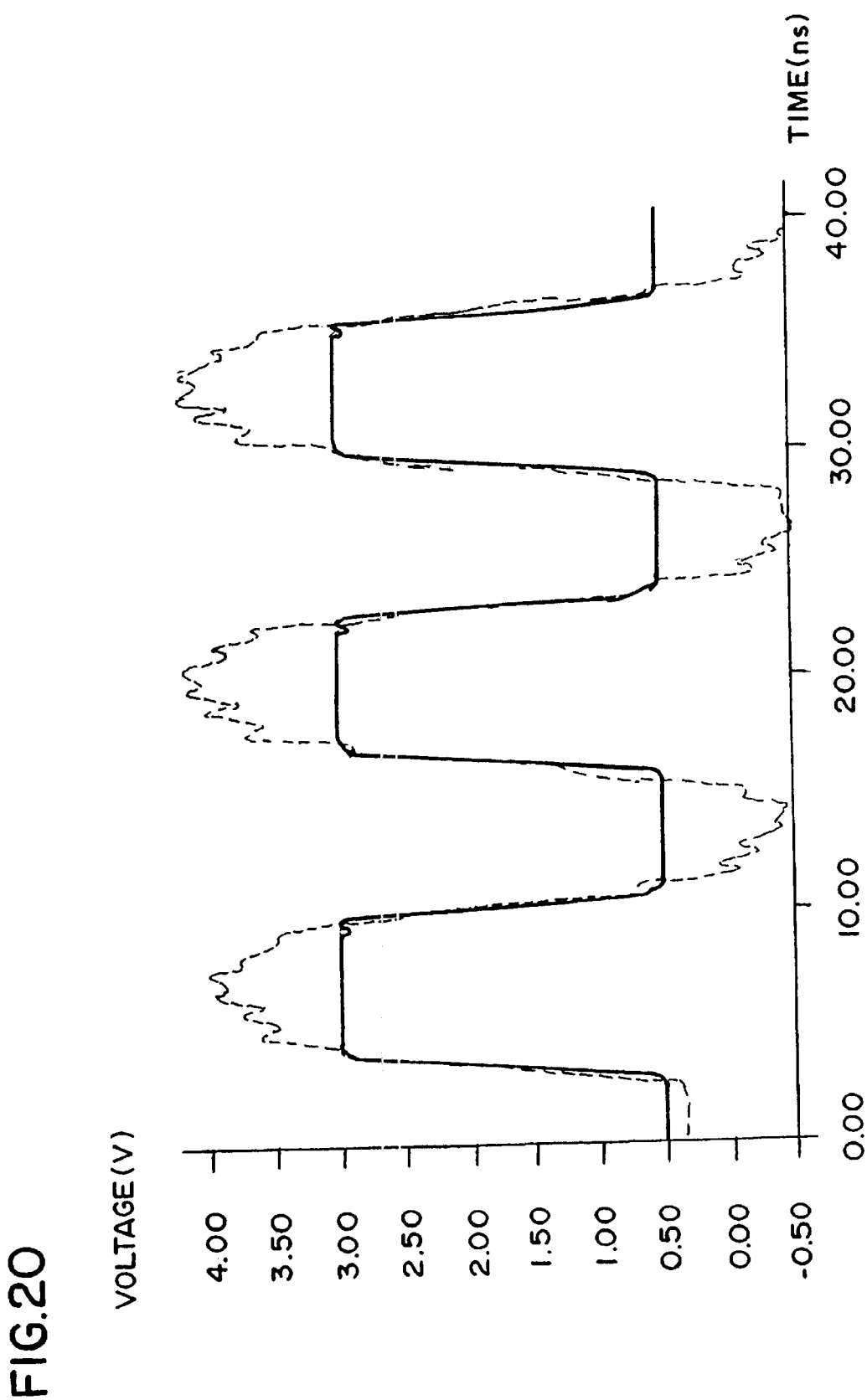
FIG. 20 shows a simulation of the clock as observed at the center SDRAM of a group of 6 adjacent SDRAMs, connected as in FIG. 18. Also shown is a reference clock signal, driven into a 50 ohm transmission line terminated in 50 ohms.

FIG. 19 shows a preferred topological arrangement of a clock driver and either 6 or 9 SDRAMs. Connecting more clock lines together reduces the number of clocks required to synchronize a system, but distorts the clock line more and so introduces more uncertainty in the time of arrival of the clock at any one SDRAM (clock skew). The case of 9 clock lines has already been described; it follows from the case of the chip select net in FIG. 12. The case of 6 clock lines is our preferred embodiment. In this case each group of 3 adjacent modules on the front surface of the card are connected with a single via at the midpoint to the 3 adjacent modules on the back surface. Outer surface, high impedance wiring connects the SDRAMs themselves while internal wiring is used to connect the midpoint of the group to the card edge connector.

It is expected a memory system as in FIG. 1, that all memory SIMM connectors are not populated with memory SIMM. In that case clock lines from the memory clock chip are not terminated. FIG. 19 shows the expected results. Shown are three curve; the smooth curve is a reference line showing the clock line terminated in 50 ohms; the signal ranging from +5 volts to −2 Volts is a clock line to an empty memory connector. The intermediate signal is for an empty SIMM socket but with resistive termination as shown in FIG. 19. Overshoot and undershoot are strongly suppressed, which reducing signal noise on other active nets and also greatly reduces emitted radiation (EMI). The resistive terminators are placed as close as possible to the SDRAMs, as previously described and as shown in FIG. 3. For fixed clock slew rate (4.0 V/ns into a 50 ohm terminated line) and clamped receivers, the equivalent termination resistance is a function of clock frequency. For example, a 75 MHz clock requires 100 ohm termination while a 37 MHz clock requires just 150 ohm termination.

Figure 22:
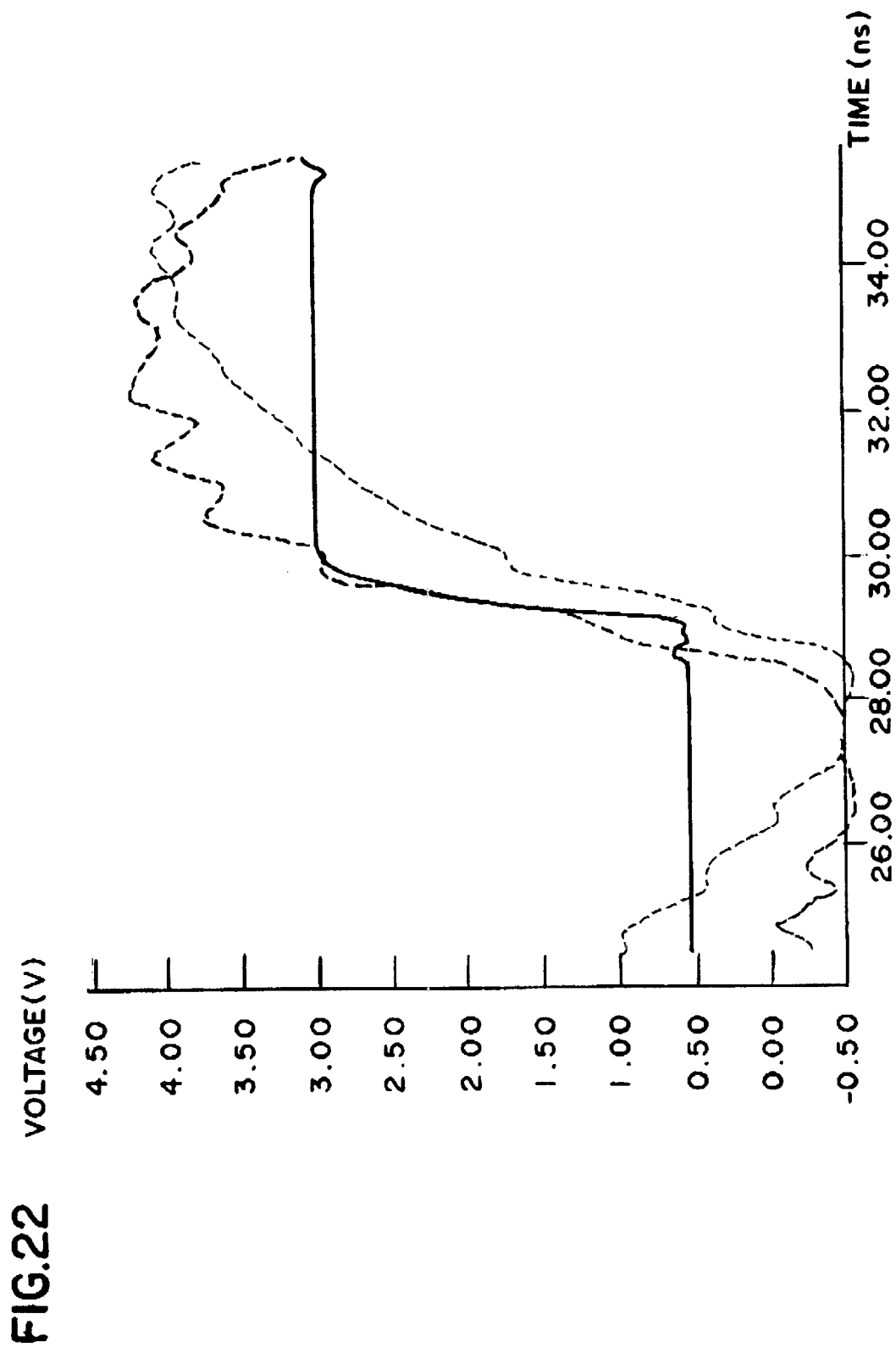
FIG. 22 shows a comparison of FIGS. 22 and 23, on an expanded scale.

Since SDRAMs trigger on the rising edge of the clock, we sought to make the rising edge as fast and distortion free as possible. This is the reason for the choice of resistor values shown in FIG. 18. The equivalent resistance of a 160 resistor to Vdd and a 320 ohm resistor to ground is our desired 100 ohms, but attenuated transition to Vdd more than transitions to ground. FIG. 17 shows the simulated clock line as measured at the SDRAM, for the case of 6 SDRAMs per clock line. The slew rate is 2.0 V/ns at 75 MHz, about twice that of the reference 50 ohm line, as seen from the expanded scale of FIG. 22. It is likely that by varying slightly the resistive termination that the small distortion around 1.2 volts can be moved to lower voltages, increasing the slew rate to 4V/ns. That is another reason to prefer 6 DRAMs per clock line.

With 6 SDRAMs per clock, the 16 SIMMs on the memory card of FIG. 1 require approximately 64 clocks if all buffers are registered. Power dissipated in the chip is 53 mW per (6 load) clock line, with 44 mW in the driver channel and 9 mW in the source resistance. After correcting to 3.3 V we predict 2.6 W for the OCD portion of the clock chip, including the register clock lines. This amount of heat may be dissipated by the memory clock chip of FIG. 1, although a heat sink may be required.

Figure 21:
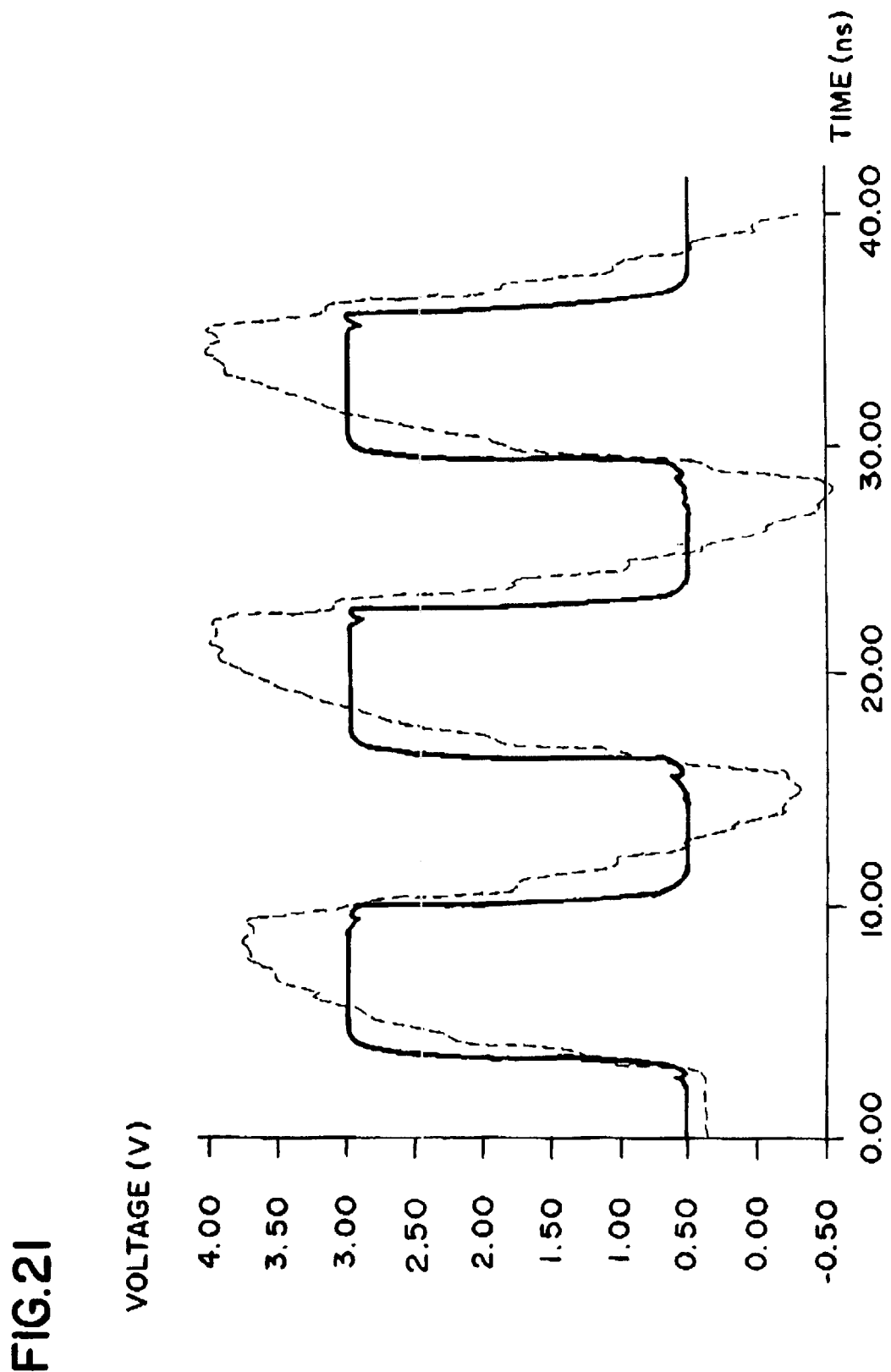
FIG. 21 shows a simulation of the clock as observed at the center SDRAM of a group of 9 SDRAMs, connected as in FIG. 18. Also shown is a reference clock signal, driven into a 50 ohm transmission line terminated in 50 ohms.

FIG. 21 shows the simulated clock signals at the SDRAMs for 9 SDRAMs per clock, as described by FIG. 18. The slew rate decreased to 1.2 V/ns, as a result of increased capacitive loading. The clock is also delayed by 0.7 ns (measured at 1.5V) with respect to the 6 load case. This is a potential problem if the same clock chip is used to register the data into the data muxes. However, fewer clock lines are required. With 9 SDRAMs per clock, 16 SIMMs require approximately 48 clocks if all buffers are registered. The power dissipated in the clock chip is increased to 69 mW per (9 load) clock line, with 56 mW in the driver channel and 13 mW in the source resistance. After correcting to 3.3 V we predict 2.3 W for OCD portion of the clock chip, including the register clock lines. This is about 15% less than the heat dissipated for the 64 clock chip required for 6 loads per clock, and may be interesting in applications where power saving is critical.

In summary, we have described a compact organization of a plurality of data processing units, a plurality of synchronous memory storage devices, and a processor-memory control unit. Identified is a synchronized clock structure to allow for high speed synchronous communication between processor and memory, and a structure and wiring topology to and from an intermediate set of buffer/registers for communication between the memory control unit and the SDRAMs. Also shown is a structure for DC power connections, connection to peripheral devices, and efficient cooling.

While the invention has been shown and described with respect to particular embodiments thereof, it will be understood by those skilled in the art that changes in form and detail may be made without departing from the spirit and scope of the invention. In particular these structures hold for other synchronous and semi-synchronous memory devices, for example SRAMs.

We claim:

1. A structure comprising:

a plurality of memory elements;

a single memory control unit for controlling each of said plurality of memory elements;

a plurality of memory devices on said plurality of memory elements;

a plurality of buffers and/or registers;

a memory control unit;

means for connecting signals between said plurality of memory devices on said plurality of memory elements and said plurality of buffers and/or registers; and means for connecting signals between said plurality of buffers and/or registers and said memory control unit;

a memory clock for synchronizing signals between said plurality of memory devices on said plurality of memory elements and said memory control unit;

a processor clock;

a system clock;

means for electrically interconnecting said memory clock, said processor clock and said system clock, said memory clock and said processor clock are synchronized to said system clock.

2. A structure according to claim 1 wherein said memory elements are selected from the group consisting of SIMMs and DIMMS.

3. A structure comprising:

a CPU card;

a memory card;

a CPU planar;

said CPU card and said memory card are mounted in electrical communication with said CPU planar;

said CPU card comprises: a CPU clock, a data processor, and a cache memory;

means for electrically interconnecting said CPU clock, said data processor and said cache memory;

said CPU clock synchronizes communication between said CPU clock, said data processor and said cache memory, said cache memory card comprises:

a memory clock;

a plurality of memory elements each comprising a plurality of memory devices;

a single memory control unit for controlling each of said plurality of memory elements; a plurality of buffers and/or registers;

means for electrically interconnecting said plurality of memory elements and said plurality of buffers and/or registers;

said memory clock synchronizes communication between said plurality of memory elements and said buffers and/or registers;

said CPU planar comprises: a CPU planar clock, a memory processor control unit, and a CPU planar memory;

means for synchronizing signals between said plurality of memory devices on said plurality of memory elements and said memory-processor control unit comprising said memory clock and said CPU planar clock;

means for synchronizing signals between said data processing units and said memory-processor control unit comprising said processor clock and said CPU planar clock; and said memory clock and said processor clock are synchronized to said system clock.

4. A structure comprising:

one or more memory units, each memory unit comprising:
  a plurality of memory elements;
  a plurality of synchronous memory devices on said plurality of memory elements;
  a plurality of registers;
  a memory unit clock of at least 75 MHz for providing a synchronous memory timing signal;
  means for connecting signals between said plurality of synchronous memory devices on said plurality of memory elements and said plurality of registers;
  means for connecting signals between said plurality of synchronous memory devices on said plurality of synchronous memory elements and said memory unit clock;

one or more processing units;

each said processing unit comprising a processing clock, and one or more processors;

an interconnection substrate comprising an electrical interconnection means, a single memory control unit for controlling one or more of said memory units, one or more processing units and a system clock;

said memory unit and said processing unit are mounted in electrical communication with said interconnection substrate; and means for electrically interconnecting said memory clock, said processor clock and said system clock, said memory clock and said processor clock are synchronized to said system clock.

5. A structure comprising:

a plurality of memory elements;

a plurality of synchronous memory devices on said plurality of synchronous memory elements;

a plurality of registers;

a synchronous memory-processor control unit;

one or more data processing unit;

one or more memory clock of at least 75 MHZ for clocking said plurality of memory elements;

a processor clock for clocking said data processing control unit;

a system clock for clocking said memory control unit;

means for connecting signals between said synchronous memory devices on said plurality of memory elements and said plurality of registers;

means for connecting signals between said plurality of registers and said synchronous memory-processor control unit;

means for connecting signals between said data processing unit and said synchronous memory-processor control unit;

means for synchronizing signals between said plurality of memory devices on said plurality of memory elements and said synchronous memory-processor control unit comprising said memory clock and said system clock;

means for synchronizing signals between said data processing units and said synchronous memory-processor control unit comprising said memory clock and said system clock; and said memory clock and said processor clock are synchronized to said system clock.

6. A structure comprising:

a plurality of memory elements;

said memory elements comprising a memory DIMM dual in-line module;

a single memory control unit for controlling each of said plurality of memory elements;

a plurality of memory devices on said plurality of memory elements;

a plurality of registers;

one or more discrete transistors on said plurality of memory elements;

a memory processor control unit;

at least one or more data processing unit;

a memory clock of at least 75 MHz for clocking said plurality of memory DIMMs;

a processor clock for clocking said data processing control unit;

a system clock for clocking said memory processor control unit;

means for connecting signals between said plurality of memory devices on said plurality of memory elements and said plurality of registers; and means for connecting signals between said plurality of registers and said memory-processor control unit; and means for connecting signals between said one or more discrete transistors on said memory elements and said memory processor control unit; and means for connecting signals between said data processing unit and said memory processor-control unit; and means for synchronizing signals between said plurality of memory devices on said plurality of memory elements and said memory-processor control unit comprising said memory clock and said system clock; and said memory clock and said processor clock are synchronized to said system clock.

* * * * *